United States Patent
Kojima et al.

(10) Patent No.: US 7,616,488 B2
(45) Date of Patent: Nov. 10, 2009

(54) CURRENT OR VOLTAGE MEASUREMENT CIRCUIT, SENSE CIRCUIT, SEMICONDUCTOR NON-VOLATILE MEMORY, AND DIFFERENTIAL AMPLIFIER

(75) Inventors: Makoto Kojima, Osaka (JP); Takafumi Maruyama, Osaka (JP)

(73) Assignee: Panasonic Corporation, Osaka (JP)

( * ) Notice: Subject to any disclaimer, the term of this patent is extended or adjusted under 35 U.S.C. 154(b) by 103 days.

(21) Appl. No.: 12/064,712

(22) PCT Filed: Jul. 10, 2006

(86) PCT No.: PCT/JP2006/313672

§ 371 (c)(1),
(2), (4) Date: Feb. 25, 2008

(87) PCT Pub. No.: WO2008/007416

PCT Pub. Date: Jan. 17, 2008

(65) Prior Publication Data

US 2009/0135651 A1    May 28, 2009

(51) Int. Cl.
*G11C 16/04*    (2006.01)

(52) U.S. Cl. .............. 365/185.16; 365/185.2; 365/185.21

(58) Field of Classification Search ............ 365/185.16, 365/185.2, 185.21, 185.25, 205, 207
See application file for complete search history.

(56) References Cited

U.S. PATENT DOCUMENTS

| 5,889,699 | A | 3/1999 | Takano |
| 6,128,226 | A | 10/2000 | Eitan et al. |
| 6,229,746 | B1 * | 5/2001 | Tooher ....................... 365/194 |
| 6,453,433 | B1 * | 9/2002 | Vollrath ...................... 714/718 |
| 6,490,214 | B2 * | 12/2002 | Kawasumi ............. 365/210.12 |
| 6,717,877 | B2 * | 4/2004 | Suzuki et al. ........... 365/210.12 |
| 6,822,907 | B2 * | 11/2004 | Maruyama et al. ...... 365/185.21 |
| 6,839,295 | B1 * | 1/2005 | Jeung .................... 365/189.15 |
| 2002/0060930 | A1 | 5/2002 | Endo et al. |

FOREIGN PATENT DOCUMENTS

| JP | 07-057487 | 3/1995 |
| JP | 09-251790 | 9/1997 |
| JP | 09-293382 | 11/1997 |
| JP | 2002-157876 | 5/2002 |

* cited by examiner

*Primary Examiner*—Gene N. Auduong
(74) *Attorney, Agent, or Firm*—McDermott Will & Emery LLP

(57) ABSTRACT

In a wire pair 120 including a first signal line 120a and a second signal line 120b, the first signal line 120a and the second signal line 120b are laid out so that they have substantially the same stray capacitance. Two output terminals of a measured device 1000 and an input terminal of a differential amplifier 110 are connected together by the wire pair 120. Thus, noise included in the first signal line 120a and noise included in the second signal line 120b become common-mode noise, which are canceled out by the differential amplification of the differential amplifier 110.

23 Claims, 14 Drawing Sheets

Sout = (VH_m−VH_r) − (VL_m−VL_r)

Sout = (VH_m−VL_m) − (VH_r−VL_r)

CURRENT OR VOLTAGE MEASUREMENT CIRCUIT, SENSE CIRCUIT, SEMICONDUCTOR NON-VOLATILE MEMORY, AND DIFFERENTIAL AMPLIFIER

RELATED APPLICATIONS

This application is the U.S. National Phase under 35 U.S.C. § 371 of International Application No. PCT/JP2006/313672, filed on Jul. 10, 2006, the disclosure of which Applications are incorporated by reference herein.

TECHNICAL FIELD

The present invention relates to a voltage measurement circuit for measuring a voltage between two terminals of a measured object, a current measurement circuit for measuring a current flowing into one of the two terminals of the measured object and a current flowing out of the other terminal, a sense circuit for reading out information stored in a memory cell, and a semiconductor non-volatile memory.

BACKGROUND ART

Semiconductor non-volatile memories have been more and more miniaturized and the capacity thereof has been increased. However, it has not been possible to miniaturize semiconductor non-volatile memories in accordance with the scaling law, and the cell current in the smallest cell has been decreasing. Therefore, with semiconductor non-volatile memories, there is a need for a method for sensing memory cells at a high speed and with a high sensitivity.

While the cell current decreases, the memory capacity required for a system has been increasing at a speed greater than that of miniaturization, whereby the mat size of the array in which memory cells are arranged has been increasing. There is no problem if the capacitance of bit lines, etc., decreases as the miniaturization proceeds. In fact, however, the miniaturization of the memory cell size has slowed down, with the fringe capacitance in the lateral direction of the bit line having increased, and this, combined with the increase in the array mat size, leads to an increase in the bit line capacitance. An increase in the bit line capacitance may cause problems for a sensing operation with a high sensitivity.

Moreover, it is necessary to maintain an access speed even when the memory capacity increases. Therefore, there is a need for a sense amplifier and a sensing method that are faster and more sensitive in order to maintain the access speed.

For example, the VGA (Virtual Ground Array Architecture) structure is well known in the art as an array architecture that is suitable for high degree of integration for a semiconductor non-volatile memory, and various techniques have been developed for maintaining the symmetry of the differential input as much as possible by using the differential-amplification type sense amplifier in order to increase the sensing operation of the array of the VGA structure.

Specifically, a method has been proposed in the art, in which a folded bit line arrangement is employed for bit lines so that the bit line-reference bit line distance is significantly shortened as compared with the previous open bit line arrangement, whereby the electric characteristics are unlikely to fall out of balance and the noise voltage introduced to the wire pair from other conductors such as peripheral circuits is made as uniform as possible (see, for example, Patent Document 1).

FIG. 18 is a block diagram showing a configuration of a conventional semiconductor non-volatile memory 4000. As shown in FIG. 18, the semiconductor non-volatile memory 4000 includes memory cells, bit lines BL, word lines WL, reference bit lines BLR, a Y decoder 4001, a reference unit 4002, and a sense amplifier 4003.

The memory cells are arranged in a matrix pattern. The bit lines BL extend between columns of the memory cells arranged in a matrix pattern, and the word lines WL extend between rows of the memory cells arranged in a matrix pattern.

The reference bit lines BLR are lines provided so as to receive an equal level of noise, etc., to that on the memory cell side in a data read operation, and have an equal level of parasitic capacitance thereon to the parasitic capacitance on the bit lines BL. Normally, the reference bit line BLR is provided for each sense amplifier (a plurality of sense amplifiers share a reference bit line in some cases). Each reference bit line BLR and a bit line BL being the counterpart thereto are laid out close to each other in a pattern in which a relatively high level of symmetry is maintained.

The Y decoder 4001 connects the bit line BL, to which memory cells are connected, to the sense amplifier 4003.

The reference unit 4002 produces the reference voltage Vref to be used by the sense amplifier 4003.

The sense amplifier 4003 amplifies the voltage difference between the voltage Vcell of the bit line BL, which is connected thereto by the Y decoder 4001, and the reference voltage Vref being the reference.

When data is read out from a memory cell in the semiconductor non-volatile memory 4000 having such a configuration, data stored in the memory cell is first read out by using two bit lines BL connected to the diffusion layer of the memory cell being read out and a word line WL connected to the gate thereof, and the voltage Vcell of the bit line BL connected to the drain side is output to the Y decoder 4001. The Y decoder 4001 outputs the voltage Vcell of a bit line BL that is connected to the drain side to the sense amplifier 4003.

The reference unit 4002 produces the reference voltage Vref, and outputs the produced reference voltage Vref to the sense amplifier 4003. Two reference bit lines BLR are selected and connected to the reference unit 4002.

Thus, the parasitic capacitance on the bit line BL connected to the memory cell from which data is being read out becomes equal to the parasitic capacitance on the reference bit line BLR connected to the reference unit 4002. In other words, the capacitance balance between the bit line BL and the reference bit line BLR is maintained, whereby each pair of bit lines receives a substantially equal level of noise. As a result, the difference between the signal read out from the memory cell and the signal read out from the reference unit is dependent substantially only on the cell current difference, which is suitable for differential amplification.

Patent Document 1: U.S. Pat. No. 6,128,226 (Page 1, FIG. 1)

DISCLOSURE OF THE INVENTION

Problems to be Solved by the Invention

However, with such a semiconductor non-volatile memory in which the folded bit line arrangement is employed for bit lines, the array size increases as the memory capacity increases, also increasing the number of memory cells to be handled by a sense amplifier. Therefore, although the distance between a bit line and a reference bit line to be compared with each other is shortened as compared with the previous open bit line arrangement, the distance may become as large as some hundreds of μm as the capacity increases. As the distance has increased, it has become more likely that there is an electrical imbalance or introduction of differential noise, thereby making it difficult to realize a sufficient speed or a sufficient sensitivity.

The present invention has been made in the view of the above, and has an object to provide a measurement circuit that is resistant to noise and suitable for precisely measuring the voltage difference in a semiconductor chip, and to provide a sense circuit capable of a sensing operation with a high sensitivity even for increased array sizes in a semiconductor non-volatile memory of a VGA structure, for example.

Means for Solving the Problems

In order to achieve the object set forth above, the present invention in one embodiment is directed to a voltage measurement circuit for measuring a voltage difference between a first voltage and a second voltage, the voltage measurement circuit including:

a wire pair including a first wire to which the first voltage is supplied and a second wire to which the second voltage is supplied, wherein the first wire and the second wire are configured so that a stray capacitance of the first wire and a stray capacitance of the second wire are substantially equal to each other; and a differential amplifier for differentially amplifying a voltage received through the first wire and a voltage received through the second wire.

In one embodiment, the present invention is directed to a current measurement circuit for measuring a current flowing into one of two terminals of a measured object and a current flowing out of the other terminal, the current measurement circuit including:

a wire pair including a first wire connected to one of the two terminals and a second wire connected to the other one of the two terminals, wherein the first wire and the second wire are configured so that a stray capacitance of the first wire and a stray capacitance of the second wire are substantially equal to each other; and a differential amplifier for differentially amplifying a current flowing through the wire pair.

Thus, noise included in two input signals become common-mode noise to each other, which are canceled out through the differential amplifier. As a result, it is possible to realize measurement of the current/voltage difference that is resistant to noise and has a high precision.

In one embodiment, the present invention is directed to an invention, including:

a wire pair including a source line being a bit line that is connected to a source diffusion region of a memory cell and a drain line being a bit line that is connected to a drain diffusion region of the memory cell, wherein the source line and the drain line are configured so that a stray capacitance of the source line and a stray capacitance of the drain line are substantially equal to each other; and a differential amplifier for differentially amplifying a voltage on the source line and a voltage on the drain line.

Thus, noise included in signals input to two bit lines connected to the memory cell become common-mode noise to each other, which are canceled out through the differential amplifier. As a result, it is possible to realize a sensing operation that is resistant to noise in a memory read operation of a single-ended sensing scheme.

In one embodiment, the present invention is directed to a sense circuit as set forth above, further including:

a first precharge circuit for precharging the source line to a first voltage potential; and a second precharge circuit for precharging the drain line to a second voltage potential, wherein the differential amplifier is configured so as to perform a differential amplification operation after the precharge of the source line and that of the drain line are released.

In one embodiment, the present invention is directed to a sense circuit as set forth above, wherein:

two each of the wire pairs, the differential amplifiers, the first precharge circuits and the second precharge circuits are provided, one for reference memory cells and another for read-out memory cells from which data is read out;

a voltage of an output of the differential amplifier for read-out memory cells and a voltage of an output of the differential amplifier for reference memory cells are differentially amplified.

In one embodiment, the present invention is directed to a sense circuit as set forth above, further including a current monitor for outputting a voltage signal according to an amount of current flowing through the source line and a voltage signal according to an amount of current flowing through the drain line, wherein the differential amplifier is configured so as to differentially amplify a signal output from the current monitor.

In one embodiment, the present invention is directed to a sense circuit as set forth above, further including two current monitors for outputting a voltage signal according to an amount of current flowing through the source line and a voltage signal according to an amount of current flowing through the drain line, one for reference memory cells and another for read-out memory cells, wherein:

the differential amplifier for read-out memory cells is configured so as to differentially amplify a signal output from the current monitor for read-out memory cells;

the differential amplifier for reference memory cells is configured so as to differentially amplify a signal output from the current monitor for reference memory cells.

Thus, with a device such as a memory in which the memory state of each memory cell is read out by precharging bit lines and measuring the voltage or current of the bit lines after releasing the precharge, it is possible to improve the noise resistance in a read operation. Moreover, if reference cells are provided, it is possible to increase the speed.

In one embodiment, the present invention is directed to a semiconductor non-volatile memory of a virtual ground array architecture, including the sense circuit as set forth above, wherein the second precharge circuit is configured so that when a memory cell is to be read out, the second precharge circuit precharges a drain line of another memory cell that is adjacent to the memory cell being read out.

In one embodiment, the present invention is directed to a semiconductor non-volatile memory of a virtual ground array architecture, including the sense circuit as set forth above, wherein:

the second precharge circuit for read-out memory cells is configured so that when a read-out memory cell is to be read out, the second precharge circuit for read-out memory cells precharges a drain line of another read-out memory cell that is adjacent to the read-out memory cell being read out; and the second precharge circuit for reference cells is configured so as to precharge a drain line of a reference memory cell that is adjacent to a reference memory cell being read out.

In one embodiment, the present invention is directed to a semiconductor non-volatile memory of a virtual ground array architecture, including:

a sense circuit as set forth above;

a first memory cell and a second memory cell configured so as to be read out simultaneously; and a third memory cell provided between the first memory cell and the second memory cell, wherein the third memory cell is configured so that when the first memory cell and the second memory cell are to be read out simultaneously, a source line and a drain line connected to the third memory cell are precharged to the same potential.

In one embodiment, the present invention is directed to a semiconductor non-volatile memory as set forth above, wherein for each of the first memory cell, the second memory cell and the third memory cell, there are those for reference memory cells and those for read-out memory cells.

Thus, it is possible to realize a sensing operation that is resistant to noise in a semiconductor non-volatile memory, and when data is read out, it is possible to prevent the influence of a memory cell adjacent to the memory cell being read out. Moreover, it is possible to reduce the number of bit lines to be precharged, whereby it is possible to reduce the current level.

In one embodiment, the present invention is directed to a semiconductor non-volatile memory as set forth above, further including a switch for, when the reference cell is to be read out, electrically connecting a source line of the reference cell being read out with a source line of another reference memory cell and electrically connecting a drain line of the reference cell being read out with a drain line of the other reference cell, wherein:

the reference memory cell being read out is configured so that when the reference memory cell is read out, the reference memory cell is read out simultaneously with another reference cell; and predetermined information are stored in the two reference memory cells to be read out simultaneously so that different currents flow when reading out the two reference memory cells.

Thus, it is possible to adjust the amount of current flowing into the sense circuit, whereby it is possible to eliminate the circuit for adjusting the amount of current of the reference cell itself.

In one embodiment, the present invention is directed to a semiconductor non-volatile memory as set forth above, wherein a precharge voltage by the first precharge circuit for read-out memory cells and a precharge voltage by the first precharge circuit for reference cells are at an equal potential.

In one embodiment, the present invention is directed to a semiconductor non-volatile memory as set forth above, wherein a precharge voltage by a second precharge circuit for read-out memory cells and a precharge voltage by a second precharge circuit for reference cells are at an equal potential.

Thus, the precharge voltage of the read-out memory cell and that of the reference memory cell are equal to each other, whereby it is possible to realize a sensing operation with a high precision.

In one embodiment, the present invention is directed to a semiconductor non-volatile memory as set forth above, wherein the memory cell is a floating gate type memory cell.

In one embodiment, the present invention is directed to a semiconductor non-volatile memory as set forth above, wherein the memory cell is a MONOS (Metal Oxide Nitride Oxide Semiconductor) type memory cell.

Thus, it is possible to realize a sensing operation that is resistant to noise in a semiconductor non-volatile memory including floating gate type memory cells or MONOS type memory cells.

In one embodiment, the present invention is directed to an invention, including:

a first differential amplifier and a second differential amplifier having the same gain and different optimal input ranges; and a third differential amplifier for differentially amplifying outputs from the first differential amplifier and the second differential amplifier.

Thus, it is possible to realize a differential amplification operation of a high precision with a simple circuit configuration.

Effects of the Invention

According to the present invention, it is possible to realize a measurement of a voltage difference or a measurement of a current difference that is resistant to noise and has a high precision.

DESCRIPTION OF REFERENCE NUMERALS

Figure 1:
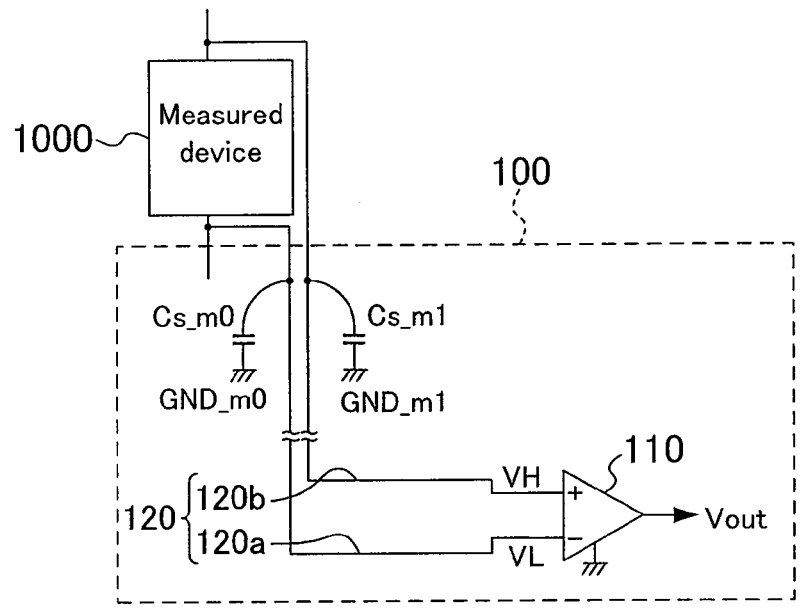
FIG. 1 is a block diagram showing a configuration of a voltage difference measurement circuit according to Embodiment 1 of the present invention.

100 Voltage difference measurement circuit
110 Differential amplifier
120 Wire pair
120a First signal line
120b Second signal line
200 Sense circuit
220 Wire pair
220a, 220b Bit lines
230a, 230b Selection transistors
240 Precharge switch precharge switch
250 Reset switch
260 Differential amplifier
300 Sense circuit
340 Pull-up resistor
350 Pull-down resistor
400 Sense circuit
440 High-side current monitor
450 Low-side current monitor
500 Sense circuit
510 Differential amplifier
520 Wire pair
520a First reference-side signal line
520b Second reference-side signal line
530a, 530b Selection transistors
540 Precharge switch
550 Reset switch
600 Amplifier section
610 Differential amplifier
620 Differential amplifier
630 Differential amplifier
700 Amplifier section
710 Voltage-type dual differential amplifier
720 Current-voltage conversion circuit
721 Resistor
722 Control Nch transistor
723 Differential amplifier
730 Current-voltage conversion circuit
731 Resistor
732 Control Pch transistor
733 Differential amplifier
800 Semiconductor non-volatile memory
810 Control circuit
820 Row predecoder
830 Row decoder
840 REF row decoder
850 Column decoder
860 Selection line decoder
870 Column selection circuit
880 Precharge/reset control circuit
890 Sense circuit block
891 Sense circuit
892 Sense circuit
1000 Measured device
2000 Memory cell
3000 Reference cell
4000 Semiconductor non-volatile memory
4001 Y decoder
4002 Reference unit
4003 Sense amplifier
ARRAY00-13 Array units
REF ARRAY Reference cell array
MC01-MC07, MC10-MC17 Memory cells
MN20, MN21 Nch transistors
MN30, MN31 Nch transistors
MP00, MP01 Current mirror transistors
MR00-MR07, MR10-MR17 Reference cells
MSL0-MSL7 Selection gate transistors
SBL0-SBL8 Sub-bit lines
RSBL0-RSBL8 Reference sub-bit lines
WL[00]-[01] Word lines of memory cell array
RWL[10]-[11] Reference word lines
SL[00]-[07] Selection line signals
RSL[00]-[07] Reference selection lines
MRSL0-MRSL7 Reference selection gate transistors
MBL[0]-[3] Main bit lines
RMBL[0]-[3] Reference main bit lines

BEST MODE FOR CARRYING OUT THE INVENTION

Embodiments of the present invention will now be described with reference to the drawings.

EMBODIMENT 1 OF PRESENT INVENTION

FIG. 1 is a block diagram showing a configuration of a voltage difference measurement circuit 100 according to Embodiment 1 of the present invention. The voltage difference measurement circuit 100 measures the voltage difference between two output terminals of a measured device 1000 by differentially amplifying the voltage between the two output terminals.

Specifically, the voltage difference measurement circuit 100 includes a differential amplifier 110 and a wire pair 120, as shown in FIG. 1.

The differential amplifier 110 amplifies the voltage difference of the input signal and outputs the obtained signal. In the present embodiment, the gain (A) of the differential amplifier 110 is set to 1. The node of the differential amplifier 110 to which a positive phase-side (high-side) voltage is input is referred to as VH, and the node to which a negative phase-side (low-side) voltage is input is referred to as VL.

The wire pair 120 is a wire pair including a first signal line 120a and a second signal line 120b. The wire pair 120 is routed from the differential amplifier 110 to the measured device 1000, and are electrically connected to the measured device 1000 for measuring the voltage difference between the two output terminals of the measured device 1000.

Modeled stray capacitances Cs_m0 and Cs_m1 exist between the first signal line 120a and the ground terminal GND_m0 and between the second signal line 120b and the ground terminal GND_m1, respectively.

The first signal line 120a and the second signal line 120b are laid out so that the stray capacitances Cs_m0 and Cs_m1 are substantially equal to each other. Specifically, the stray capacitance can be adjusted by, for example, employing a layout in which the symmetry with respect to the base layer of the wire pair 120 or the symmetry with respect to the wiring on the upper layer, or by routing GND-level wires on opposite sides of the wire pair 120.

In a conventional voltage difference measurement circuit, one end of the measured device 1000 is connected to a common terminal, e.g., the GND terminal, with the other end being extended to the voltage difference measurement circuit. In the present embodiment, nodes at opposite ends of the measured device 1000 are connected to the differential amplifier 110 via the balanced wire pair 120.

An operation of measuring the voltage difference of the present embodiment will now be described.

Typically, in a semiconductor integrated circuit, if the chip size increases and the distance between the measured device 1000 and the differential amplifier 110 increases, there occurs a difference between the GND level in the vicinity of the measured device 1000 and the GND level at a position where the voltage, or the like, is monitored.

The GND level differs from one position to another, resulting in the introduction of various noise, due to, for example, floating of the GND line voltage due to the current flowing through the GND line, and GND level bouncing due to currents produced by circuit operations at various positions. In the present embodiment, if noise is introduced to affect GND_m0 and GND_m1 of stray capacitance with respect to the GND level in the vicinity of the differential amplifier 110, the same amount of noise appears at the VH node and at the VL node because each wire of the wire pair has the same stray capacitance with respect to GND. This means that noise, being common-mode noise, are introduced to the VH node and the VL node, i.e., the two input terminals of the voltage difference measurement circuit 100. This noise is canceled before being output from the differential amplifier 110, whereby the output voltage (measured value) is a voltage that is not affected by noise.

As described above, in the present embodiment, the wire pair is routed as are twist pairs known for use in general electric circuits and is adjusted so that the wires have the same stray capacitance. In the present embodiment, the voltage between two terminals is measured while the GND connection of one terminal of the measured device, which is common in semiconductor integrated circuits, is floated from GND, whereby it is possible to realize a voltage difference measurement that is resistant to noise and has a high precision.

While the present embodiment has been described above without specifying the measured device 1000 to any particular circuit, the measured device 1000 of the present embodiment may be any of various devices such as a device with electromotive force such as a photodiode, an MRAM (Magnetoresistive RAM), a PRAM (Phase change random access memory), an FG type memory (floating gate type memory), and a MONOS (Metal Oxide Nitride Oxide Semiconductor) type memory device.

While a method for transferring readout data by using a wire pair in signal transmission of a conventional SRAM (Static RAM), a conventional DRAM (Dynamic RAM), or the like, they are sending out complementary signals, and are not those that can be used in non-complementary signal transmission such as the present embodiment.

The embodiment may also be implemented as a current measurement circuit for differentially amplifying a current flowing into, and a current flowing out of, the two terminals of the measured device. Also in such a case, noise on the wire pair is canceled before being output from the differential amplifier. Therefore, the output voltage (measured value) is a voltage that is not affected by noise, thus realizing a precise current measurement.

EMBODIMENT 2 OF PRESENT INVENTION

Figure 2:
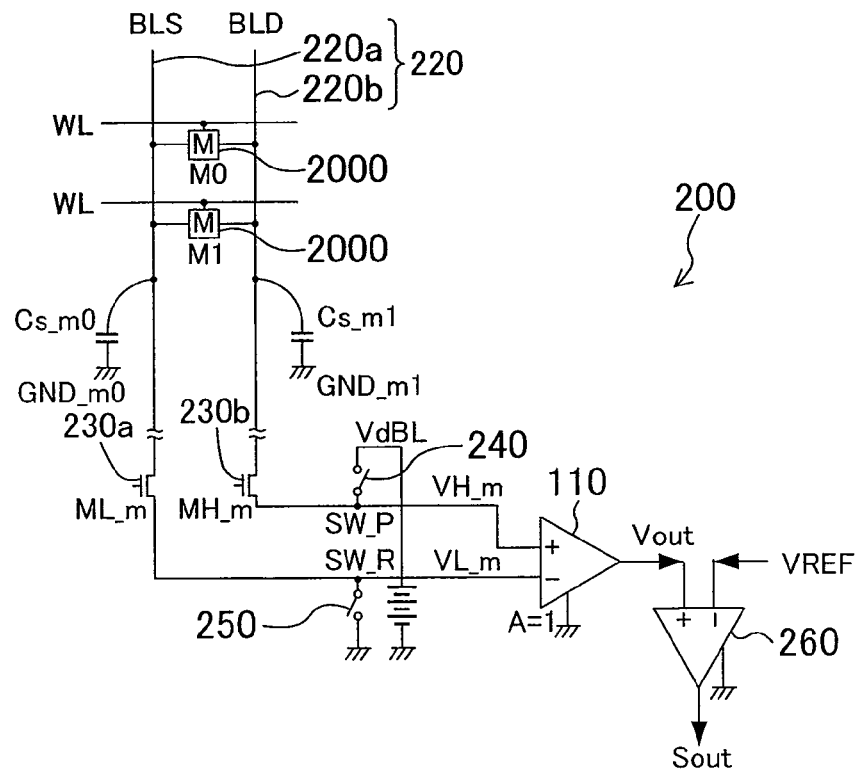
FIG. 2 is a block diagram showing a configuration of a sense circuit according to Embodiment 2 of the present invention.

FIG. 2 is a block diagram showing a configuration of a sense circuit 200 according to Embodiment 2 of the present invention. The sense circuit 200 is an application of the voltage difference measurement circuit 100 of Embodiment 1 to a sense circuit in a memory circuit.

The sense circuit 200 reads out information stored in memory cells 2000 (M0 and M1 in FIG. 2). The memory cell 2000 is a non-volatile memory whose read-out cell current varies depending on the information written therein. For the sake of simplicity, it is assumed in the present embodiment that a predetermined read-out current flows when "1" is stored as information, and no current flows when "0" is stored as information.

As shown in FIG. 2, the sense circuit 200 includes the differential amplifier 110, a wire pair 220, selection transistors 230a and 230b, a precharge switch 240, a reset switch 250, and a differential amplifier 260. In the subsequent embodiments, elements similar in function to those of Embodiment 1 are denoted by like reference numerals and will not be further described below.

The wire pair 220 includes a bit line 220a (BLS) and a bit line 220b (BLD) to connect the memory cells 2000 with the selection transistor 230a (ML_m) and the selection transistor 230b (MH_m) as shown in FIG. 2. The stray capacitance Cs_m0 is present between the bit line 220a and the ground GND_m0, and the stray capacitance Cs_m1 is present between the bit line 220b and the ground GND_m1. The capacitance balance is maintained so that Cs_m0 and Cs_m1 are equal to each other by, for example, adjusting the layout of the bit lines 220a and 220b.

The bit line 220b is connected to the high-side node VH of the differential amplifier 110 via the selection transistor 230b, and the bit line 220a is connected to the low-side node VL via the selection transistor 230a. Also between the selection transistors 230a and 230b and the differential amplifier 110, the bit lines 220a and 220b are configured so as to be a wire pair with a capacitance balance as described above.

The selection transistors 230a and 230b activate/deactivate the bit lines 220a and 220b, respectively.

The precharge switch 240 (SW_P) is a switch for precharging the bit line 220b to the precharge level VdBL.

The reset switch 250 (SW_R) is a switch for resetting the bit line 220a to the GND level.

The differential amplifier 260 outputs a signal (Sout) obtained by differentially amplifying the output voltage (Vout) of the differential amplifier 110 and the reference voltage (VREF).

When information is read out from the memory cell 2000 in the sense circuit 200 having such a configuration, first, the selection transistors 230a and 230b are turned ON, the precharge switch 240 (SW_P) is turned ON, the reset switch 250 (SW_R) is turned ON, and the word line WL for the memory cell being read out (e.g., M0) is activated.

Thus, the potential of the bit line 220b connected to high-side node VH of the differential amplifier 110 increases to the precharge level VdBL. The bit line 220a connected to the low-side node VL of the differential amplifier 110 is kept at the GND level.

Then, when the precharge switch 240 (SW_P) and the reset switch 250 (SW_R) are turned OFF, if the information stored in the activated read-out memory cell is "0", no current flows in the memory cell. Therefore, the high-side node and the low-side node of the differential amplifier 110 are both kept at the voltage level before the switch is turned OFF.

Figure 3:
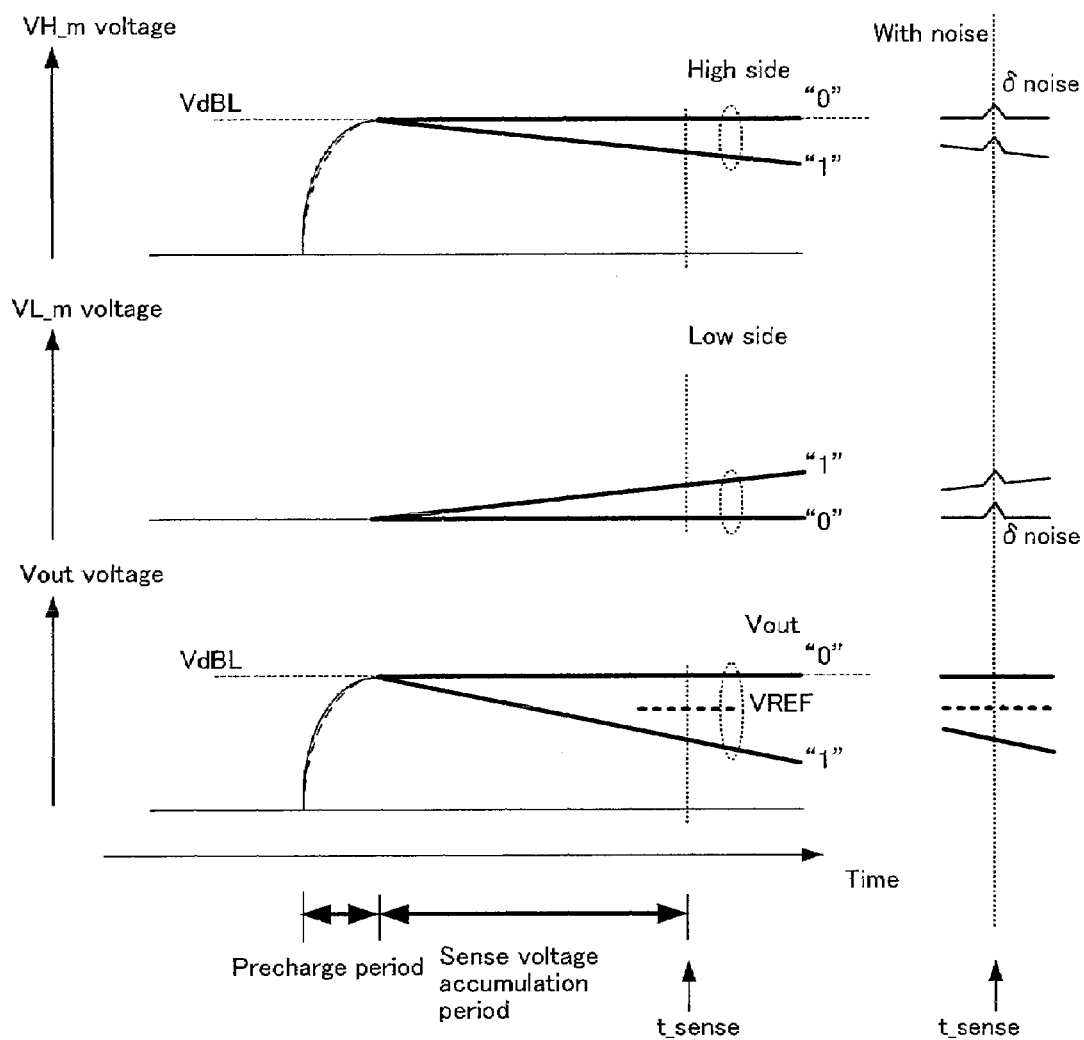
FIG. 3 is a diagram showing a voltage waveform of a bit line in a sense circuit according to Embodiment 2 of the present invention.

For example, if the information in the memory cell is "1", a predetermined read-out current flows in the memory cell, whereby the voltage at the high-side node VH of the differential amplifier 110 decreases at a certain rate. The voltage at the low-side node VL, being of the opposite polarity to the high-side node VH, increases at a certain rate. FIG. 3 is a diagram showing a voltage waveform of the bit lines 220a and 220b during an operation as described above.

For example, if noise such that the ground levels GND_m0 and GND_m1 of the stray capacitances Cs_m0 and Cs_m1 float is introduced at a sense data determination timing (a timing after an appropriate wait time, at which a predetermined level is output from the differential amplifier 260), the same amount of noise will be on signals at the high-side node VH and the low-side node VL of the differential amplifier 110 since the wire pair 220 is laid out with symmetric stray capacitances with respect to the ground. If noise input to the node VH and the node VL are common-mode noise, they are canceled out through the differential amplifier 110 and will not appear as noise in the output of the differential amplifier 110.

After an appropriate wait time for the settling of the level of the output (sensed data) from the differential amplifier 110, the output of the differential amplifier 110 is compared with the reference voltage VREF by the differential amplifier 260. Thus, a signal (Sout) indicating whether the information of the memory cell is "1" or "0" is output from the differential amplifier 260.

As described above, the present embodiment employs a configuration such that the stray capacitances of the bit lines 220a and 220b are equal to each other, whereby noise generated on the bit lines 220a and 220b are common-mode noise, which are canceled out through the differential amplifier 110. Therefore, the sensed data will not be determined erroneously, thereby realizing a read operation that is resistant to noise.

EMBODIMENT 3 OF PRESENT INVENTION

Figure 4:
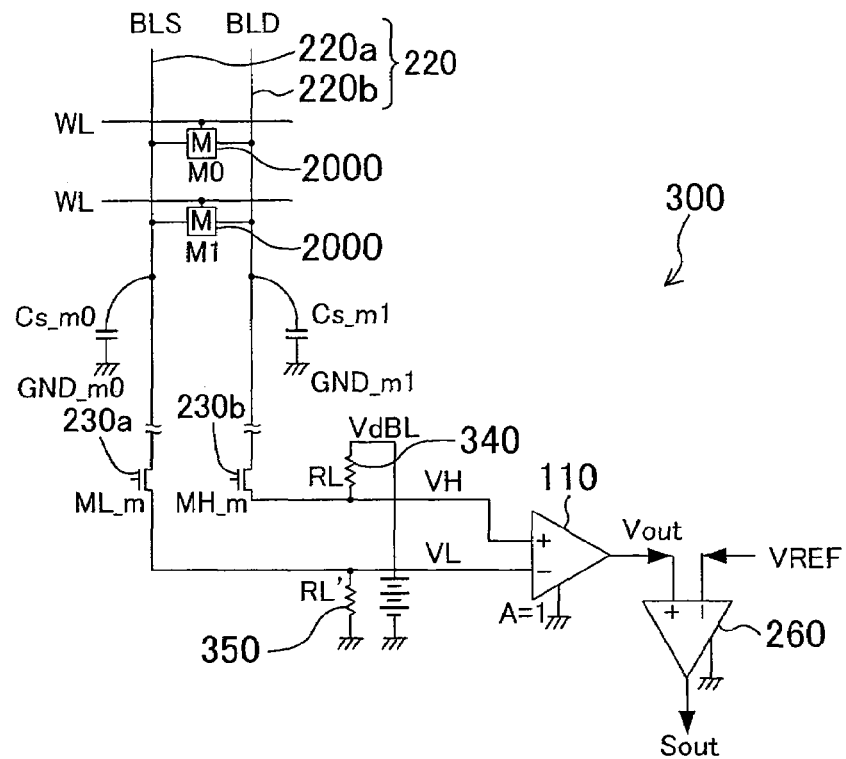
FIG. 4 is a block diagram showing a configuration of a sense circuit according to Embodiment 3 of the present invention.

FIG. 4 is a block diagram showing a configuration of a sense circuit 300 according to Embodiment 3 of the present invention. As shown in FIG. 4, the sense circuit 300 includes a pull-up resistor 340 (RL) instead of the precharge switch 240 in Embodiment 2, and a pull-down resistor 350 (RL') instead of the reset switch 250. While the sense circuit 200 of Embodiment 2 determines the state of a memory cell through a dynamic operation, the present embodiment reads out data based on the presence/absence of the read-out current dependent on the state of the memory cell, being "0" or "1".

When information is read out from the memory cell 2000 in the sense circuit 300 having such a configuration, a voltage decrease and a voltage increase occur through the pull-up resistor 340 and the pull-down resistor 350. Thus, the voltages at the high-side and low-side nodes of the differential amplifier 110 decrease, and information (data) is read out based on the degree by which the voltages at the high-side and low-side nodes decrease. As in the circuit of Embodiment 2, noise on the bit lines 220a and 220b are common-mode noise, which are canceled out through the differential amplifier 110.

Therefore, also in the present embodiment, the sensed data will not be determined erroneously, thereby realizing a read operation that is resistant to noise.

EMBODIMENT 4 OF PRESENT INVENTION

Figure 5:
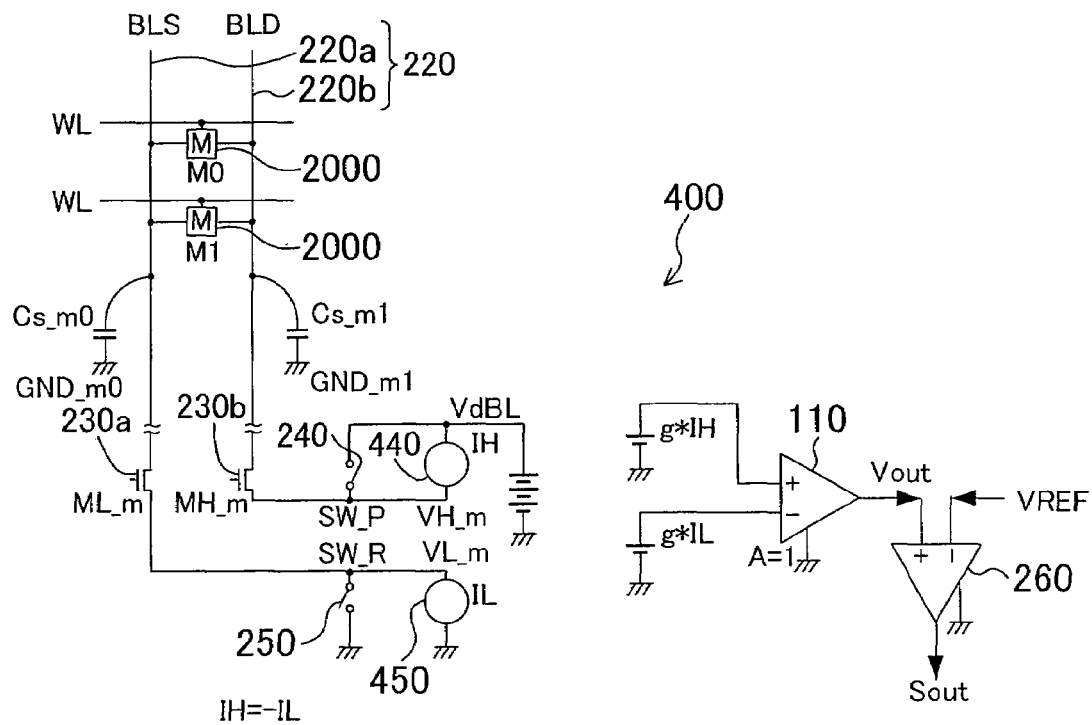
FIG. 5 is a block diagram showing a configuration of a sense circuit according to Embodiment 4 of the present invention.

FIG. 5 is a block diagram showing a configuration of a sense circuit 400 according to Embodiment 4 of the present invention.

The sense circuit 400 includes the differential amplifier 110, the wire pair 220, the selection transistors 230a and 230b, the precharge switch 240, the reset switch 250, the differential amplifier 260, a high-side current monitor 440 and a low-side current monitor 450.

The high-side current monitor 440 (current monitor IH) monitors the current flowing between the node at the precharge level VdBL and the bit line 220a so as to output a voltage obtained by multiplying the monitored current by the conductance g to the node VH of the differential amplifier 110.

The low-side current monitor 450 (current monitor IL) monitors the current flowing between the ground and the bit line 220b so as to output a voltage obtained by multiplying the monitored current by the conductance g to the node VL of the differential amplifier 110. (The current monitor and the differential amplifier 110 can be implemented by the current-driven type sense amplifier of which a specific circuit example will later be shown in Embodiment 7.)

When information is read out from the memory cell 2000 in the sense circuit 400 having such a configuration, first, the selection transistors 230a and 230b are turned ON, the precharge switch 240 (SW_P) is turned ON, the reset switch 250 (SW_R) is turned ON, and the word line WL for the selected memory cell (e.g., M0) is activated. Thus, the potential of the bit line 220b connected to high-side node VH of the differential amplifier 110 increases to the precharge level VdBL. The bit line 220a connected to the low-side node VL of the differential amplifier 110 is kept at the GND level. In this process, no current flows through the high-side current monitor 440 and the low-side current monitor 450 because the opposite ends of each of the monitors are shorted together via the precharge switch 240 and the reset switch 250.

Then, when the precharge switch 240 (SW_P) and the reset switch 250 (SW_R) are turned OFF, if information stored in the activated read-out memory cell is "0", no current flows through the memory cell, whereby the high-side node and the low-side node of the differential amplifier 110 are both kept at the voltage level before the switch is turned OFF. Therefore, no current flows through the high-side current monitor 440 and the low-side current monitor 450.

Figure 6:
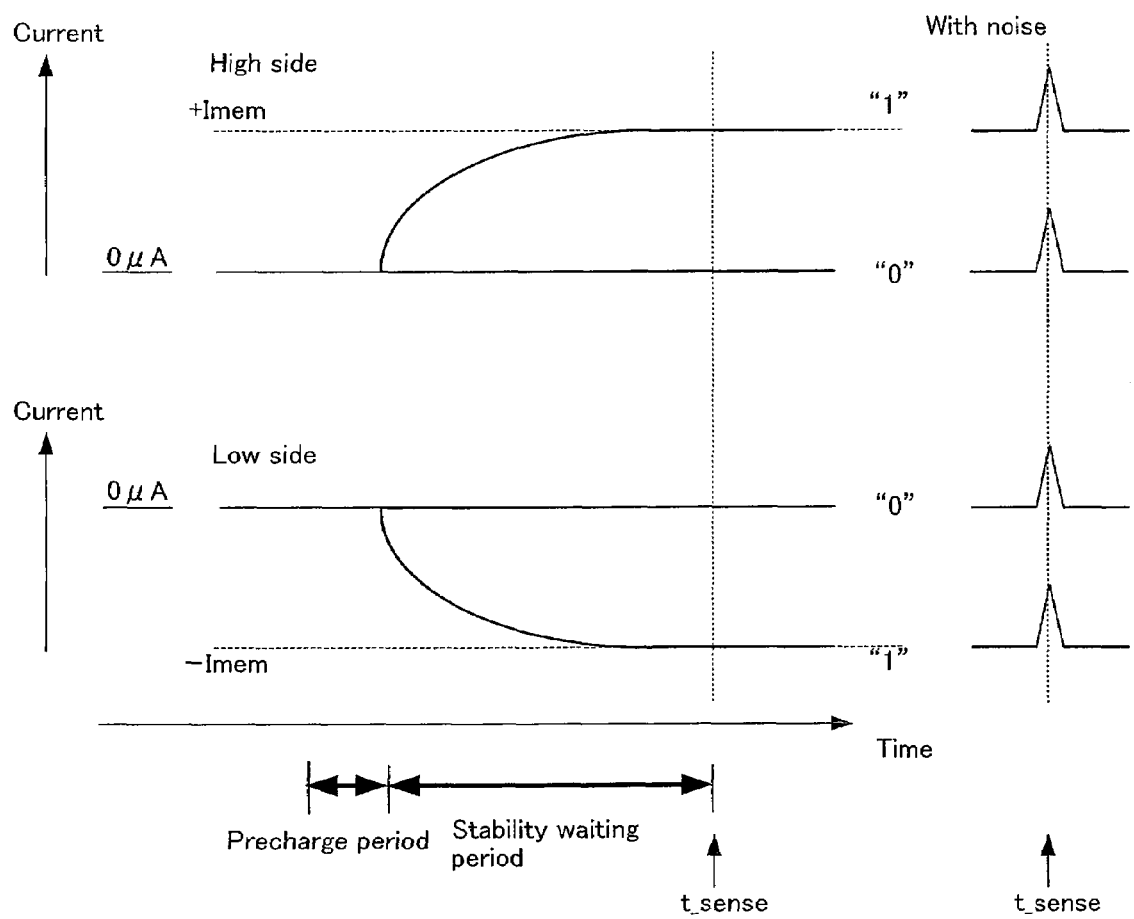
FIG. 6 is a diagram showing a current waveform of a high-side current monitor and that of a low-side current monitor in a sense circuit according to Embodiment 4 of the present invention.

If the information of the cell is "1", a predetermined read-out current flows out of the memory cell, whereby a read-out current (IH) flows out of the high-side current monitor 440, and a current (−IL) of the opposite polarity to the high-side current monitor 440 flows through the low-side current monitor 450. A voltage obtained by multiplying the monitored current by the conductance g is output from each of the high-side current monitor 440 and the low-side current monitor 450. FIG. 6 is a diagram showing a current waveform of the high-side current monitor 440 and that of the low-side current monitor 450 during an operation as described above. In the figure, +Imem and −Imem each denote a current (memory cell current) flowing out of the cell in a read operation.

For example, if noise such that the ground levels GND_m0 and GND_m1 of the stray capacitances Cs_m0 and Cs_m1 float is introduced at a timing at which sense data is determined by the differential amplifier 260, the change in the ground voltage becomes a transitional current and the same amount of current flows into the bit line 220a and the bit line 220b, since the wire pair 220 is laid out with symmetric stray capacitances with respect to the ground. The transitional current is monitored by the high-side current monitor 440 and the low-side current monitor 450 to be input to the differential amplifier 110. The noise input to the node VH and that input to the node VL are equal common-mode noise. The noise input to the nodes are canceled out through the differential amplifier 110 and will not appear as noise in the output of the differential amplifier 110.

Therefore, also in the present embodiment, the sensed data will not be determined erroneously, thereby realizing a read operation that is resistant to noise.

EMBODIMENT 5 OF PRESENT INVENTION

Figure 7:
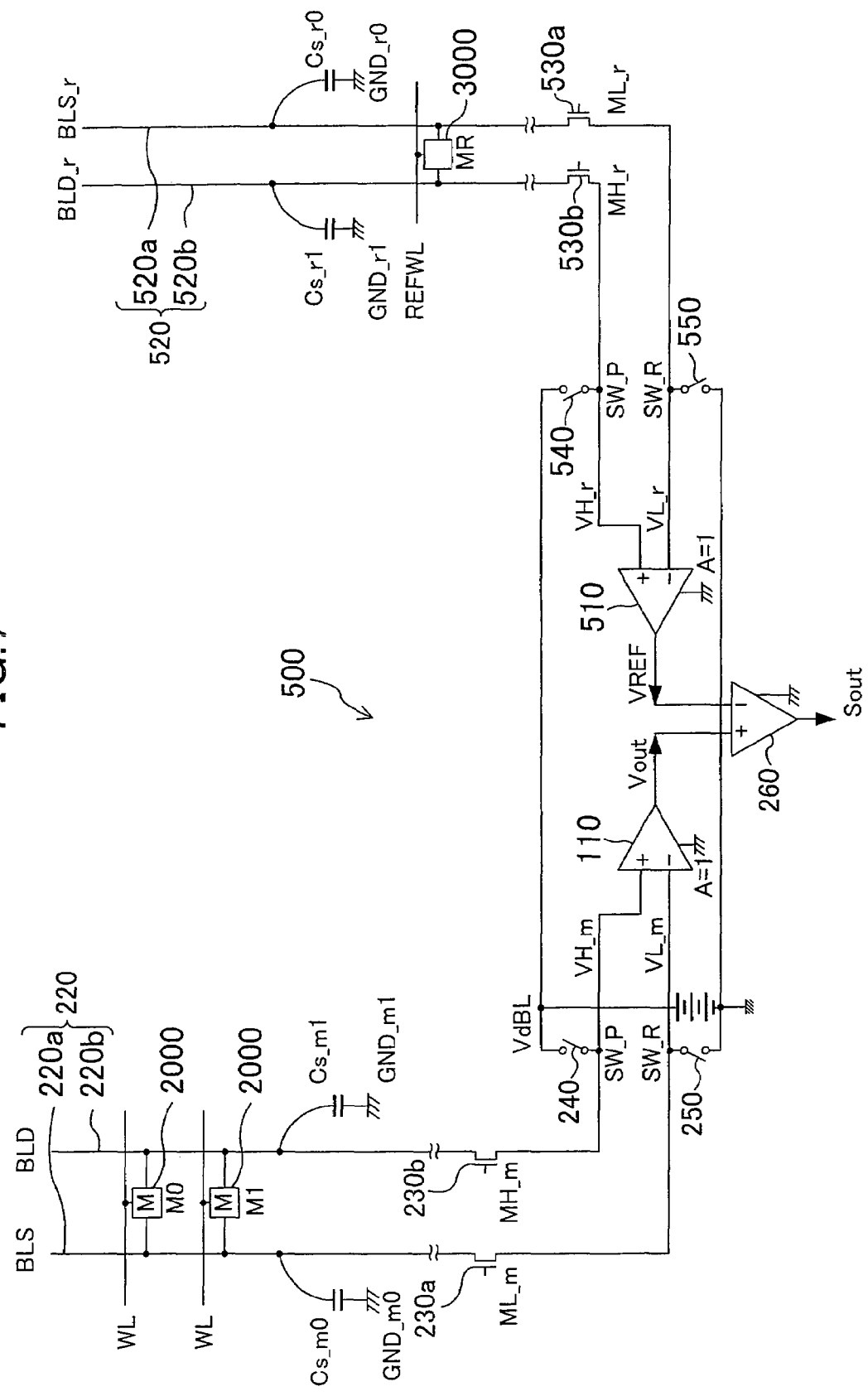
FIG. 7 is a block diagram showing a configuration of a sense circuit according to Embodiment 5 of the present invention.

FIG. 7 is a block diagram showing a configuration of a sense circuit 500 according to Embodiment 5 of the present invention.

Embodiment 5 is directed to an example of a sense circuit in a memory circuit provided with a reference cell 3000 (MR) whose read-out current is adjusted to about one half of that of the memory cell 2000.

As shown in FIG. 7, the sense circuit 500 further includes a wire pair 520, selection transistors 530a and 530b, a precharge switch 540 and a reset switch 550, as compared with the sense circuit 200.

The differential amplifier 510 amplifies the voltage difference of the input signal and outputs the obtained signal. In the present embodiment, the gain (A) of the differential amplifier 510 is set to 1.

The wire pair 520 includes a first reference-side signal line 520a (BLS_r) and a second reference-side signal line 520b (BLD_r) to connect the reference cell 3000 with the selection transistor 530a (ML_r) and the selection transistor 530b (MH_r). The stray capacitance Cs_r0 is present between the first reference-side signal line 520a and the ground GND_r0, and the stray capacitance Cs_r1 is present between the second reference-side signal line 520b and the ground GND_r1. The capacitance balance is maintained so that Cs_r0 and Cs_r1 are equal to each other by adjusting the layout of the first reference-side signal line 520a and the second reference-side signal line 520b.

The second reference-side signal line 520b is connected to the high-side node VH of the differential amplifier 510 via the selection transistor 530b, and the first reference-side signal line 520a is connected to the low-side node VL via the selection transistor 530a. Also between the selection transistors 530a and 530b and the differential amplifier 510, the first reference-side signal line 520a and the second reference-side signal line 520b are configured so as to be a wire pair with a capacitance balance as described above.

The selection transistors 530a and 530b activate/deactivate the first reference-side signal lines 520a and 520b, respectively.

In the present embodiment, the precharge, reset, VdBL and GND nodes are shared between the memory cell 2000 side and the reference cell 3000 side, so that the memory cell side and the reference side are powered via the shared nodes. This is because if different voltages are supplied to the memory cell 2000 side and to the reference cell 3000 side, which are to be compared with each other, the difference becomes an error in the output.

When information is read out from the memory cell 2000 in the sense circuit 500 having such a configuration, the memory cell 2000 and the reference cell 3000 are operated totally symmetrically with each other, except that the reference cell 3000 side is controlled by the memory reference word line REFWL.

First, the selection transistors 230a, 230b, 530a and 530b are turned ON, the precharge switches 240 and 540 (SW_P) is turned ON, the reset switches 250 and 550 (SW_R) is turned ON, and the word line WL for the selected memory cell (e.g., M0) and the memory reference word line REFWL are activated.

Then, when the precharge switches 240 and 540 and the reset switches 250 and 550 are turned OFF, the gap (voltage difference) between the voltage waveform of the wire pair 220 (the voltage waveform representing whether the information is "0" or "1") and the voltage waveform of the wire pair 520 increases.

Figure 8:
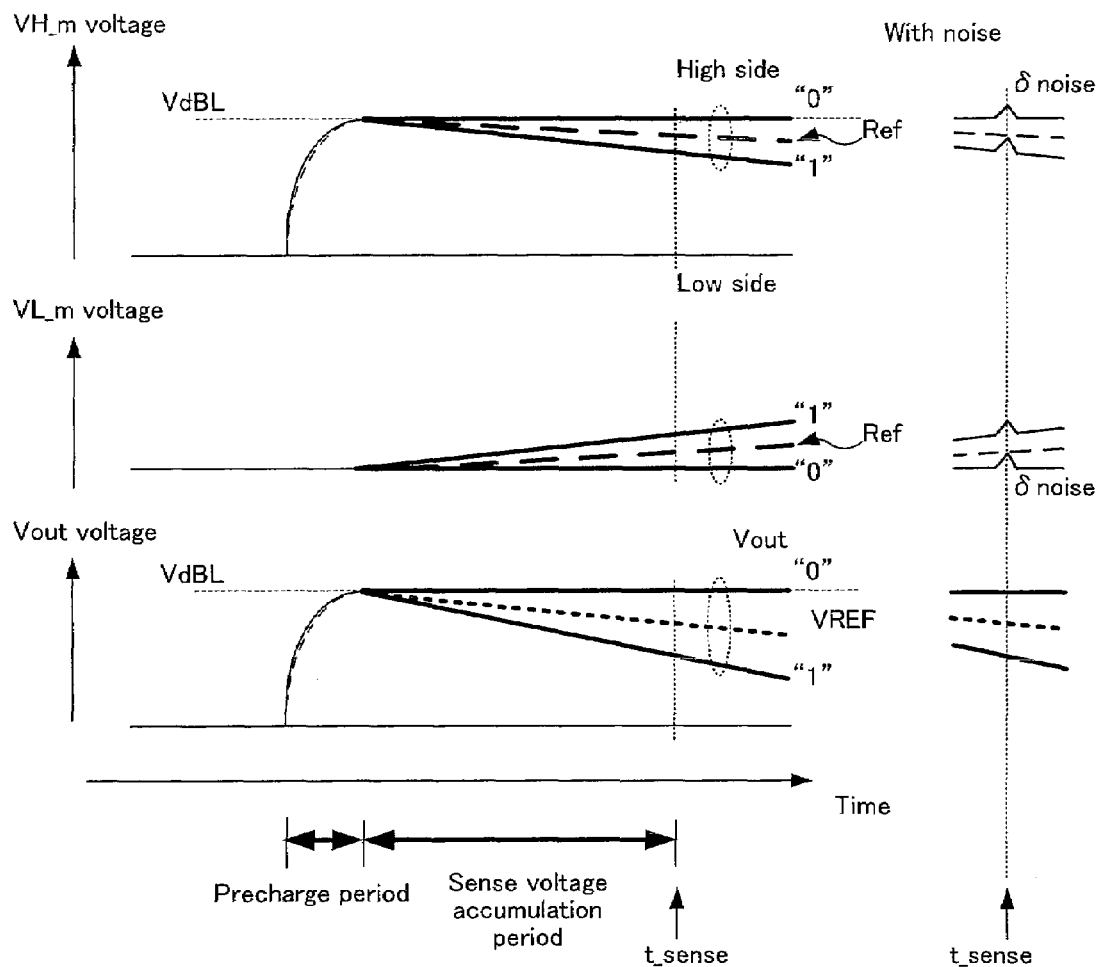
FIG. 8 is a diagram showing voltage waveforms of different bit lines in a sense circuit according to Embodiment 5 of the present invention.

FIG. 8 shows voltage waveforms of the bit lines 220b and 220a and the second reference-side signal line 520b and the first reference-side signal line 520a on the reference cell 3000 side when the information of the memory cell is "0" and when it is "1". Since the cell current of the reference cell 3000 is set to be one half of the cell current of the memory cell 2000, the voltage waveform (Ref) of the wire pair 520 is located exactly in the middle between the voltage waveform when the information is "0" and the voltage waveform when the information is "1". Starting from the timing at which the precharge switches 240 and 540 and the reset switches 250 and 550 are turned OFF, the gap between the voltage waveform when the information is "1" and the voltage waveform of the wire pair 520 and the gap between the voltage waveform when the information is "0" and the voltage waveform of the wire pair 520 increase.

For example, when noise is applied to the wire pair 220, the noise on the bit lines 220a and 220b are common-mode noise, whereby no noise will appear in the output (Vout) of the differential amplifier 110, as shown in FIG. 8.

If one employs a layout in which the bit line on the memory cell 2000 side and the bit line on the reference cell 3000 side are spaced apart from each other, the symmetry of noise in the ground, etc., will be lost, but according to the present embodiment, it is possible to avoid deterioration of noise resistance.

In the present embodiment, the read-out speed can be improved by moving forward the timing of making a determination in a read operation. For example, in Embodiment 2, information can be sensed only after the voltage when the information is "1" has moved across the reference potential VREF. Of course, the timing of sensing the information can be changed also in Embodiment 2 by changing the settings of the reference voltage VREF, but the limit will be first reached, in view of the variation factor, the number of factors, the amount of variation, and the variation in symmetry, etc. In contrast, in the present embodiment, the AC-wise matching is done by the reference cell 3000, whereby the sensing timing (t_sense) can be moved forward from that shown in FIG. 8. Specifically, it can be moved forward as much as possible until reaching the limit of the following differential amplifier 260 which determines the voltage difference.

As described above, according to the present embodiment, it is possible to realize a high-precision, high-speed sensing operation without deteriorating the noise resistance.

EMBODIMENT 6 OF PRESENT INVENTION

Figure 9:
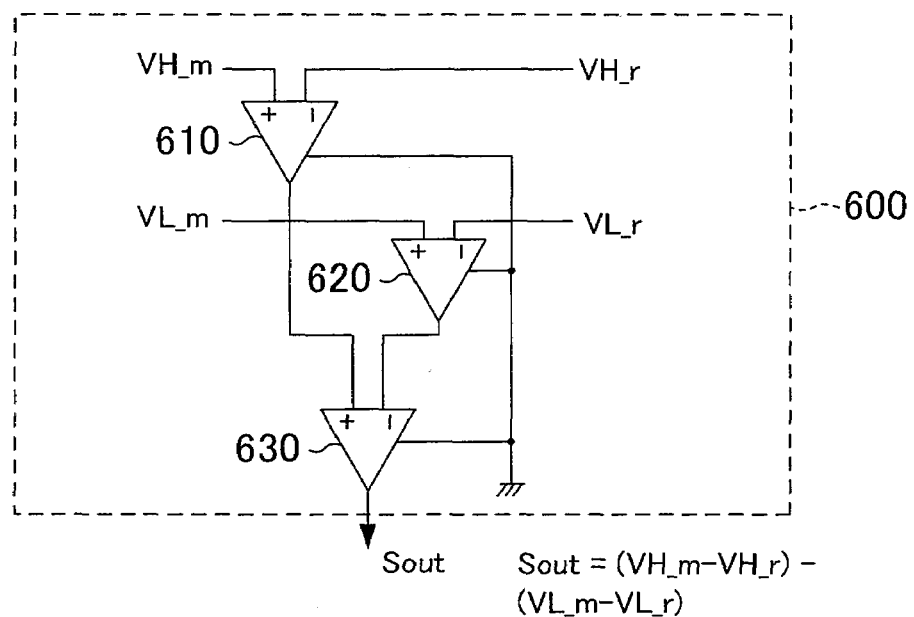
FIG. 9 is a block diagram showing a configuration of an amplifier section in a sense circuit according to Embodiment 6 of the present invention.

An amplifier section shown in FIG. 9 may be used in place of the differential amplifier 110, the differential amplifier 260 and the differential amplifier 510 (these are referred to as the "amplifier section") of Embodiment 5. The present amplifier section is an example with which it is possible to reduce the circuit scale from that with the amplifier section of Embodiment 5.

Figure 10:
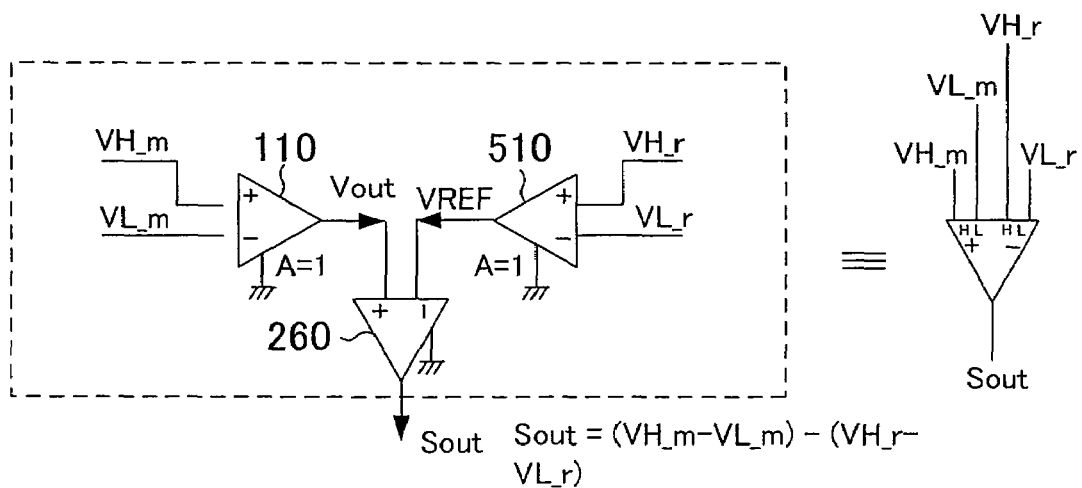
FIG. 10 is a block diagram showing a configuration of an amplifier section in a sense circuit according to Embodiment 5 of the present invention.

First, the amplifier section of Embodiment 5 will be described in detail. FIG. 10 is a reproduction of the amplifier section of Embodiment 5. This configuration can be viewed as a dual differential amplifier (voltage-type dual differential amplifier). In the amplifier section of Embodiment 5, the inputs from the nodes VH_m and VL_m (the high-side and low-side nodes on the memory cell 2000 side) are differentially amplified without using a very high gain for the amplifier of the initial stage (the differential amplifier 110) (herein, the gain A=1). Similarly, the differential amplifier 510 is configured to differentially amplify the inputs from the high-side and low-side nodes on the reference cell 3000 side. Then, the output of the differential amplifier 110 and the output of the differential amplifier 510 are input to the amplifier of the next stage (the differential amplifier 260) where they are differentially amplified.

With such a configuration, the amplifier of the initial stage performs the differential amplification of the high-side level and the low-side level of the bit line, and then the output of the differential amplifier 110 and the output of the differential amplifier 510 are differentially amplified, whereby the input range of the amplifier of the initial stage will be wide. Thus, the amplifier of the initial stage needs to perform amplification with a relatively large input range, and this cannot be achieved with a simple differential amplification using a MOS amplifier, or the like. Thus, the amplifier of the initial stage requires various additional circuits, and the circuit scale therefore tends to be large.

In contrast, an amplifier section 600 of Embodiment 6 includes a differential amplifier 610, a differential amplifier 620 and a differential amplifier 630 as shown in FIG. 9. In the amplifier section 600, the voltage at the node VH_m and the voltage at the node VH_r, from among the signals received from the four nodes (VH_m, VL_m, VH_r and VL_r), are differentially amplified through the differential amplifier 610 and the voltage at the node VL_m and the voltage at the node VL_r are differentially amplified through the differential amplifier 620, after which the output of the differential amplifier 610 and the output of the differential amplifier 620 are differentially amplified through the differential amplifier 630. Therefore, according to the present embodiment, the amplifier of the initial stage does not need to perform signal amplifications with a large input range.

Where the gain (A) of each amplifier is A=1, the voltage (Sout) that is eventually output from the amplifier section of Embodiment 5 and that from the amplifier section 600 are as shown in expressions in FIG. 10 and FIG. 9, respectively. Transposing terms in these expressions will show that these outputs are of the same value.

Figure 11:
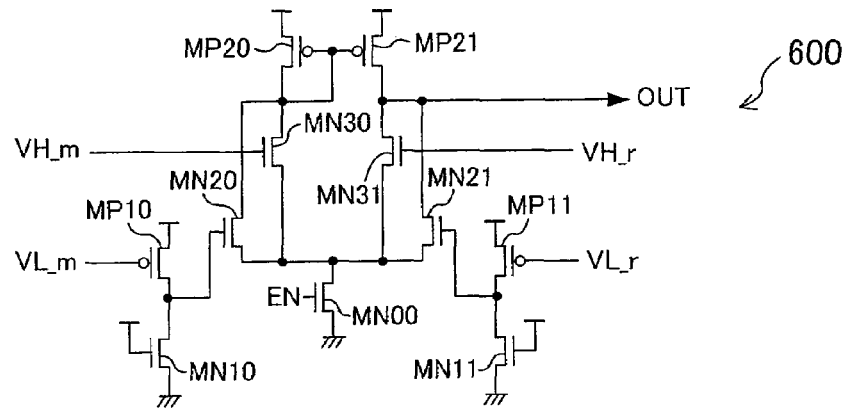
FIG. 11 is a diagram showing a specific configuration example of an amplifier section in a sense circuit according to Embodiment 6 of the present invention.

FIG. 11 is a diagram showing a specific configuration example of the amplifier section 600. The amplifier section includes a current-limiting transistor MN00 and current mirror transistors MP00 and MP01, and the Nch transistors MN30 and MN31 controlled by first differential inputs (VH_m and VH_r) are connected therebetween. Only with elements introduced so far, it is an ordinary differential amplifier, which differentially amplifies two inputs each being at a high-side level.

In the amplifier section 600, Nch transistors MN20 and MN21 are connected for still other differential inputs. Moreover, a level shifter and inverter including the Pch transistor MP10 and the Nch load MN10 is connected to the node VL_m side, and the output thereof is connected to the gate of the Nch transistor MN20. This similarly applies to the opposite node VL_r. The level, the gain, etc., of the amplifier section can be set according to the device size.

As described above, according to the present embodiment, the range of the signal input to each amplifier of the initial stage is smaller than that for the amplifier of Embodiment 2, it is possible to realize a dual differential amplifier with a smaller circuit scale than that with the amplifier section of Embodiment 2.

EMBODIMENT 7 OF PRESENT INVENTION

Figure 12:
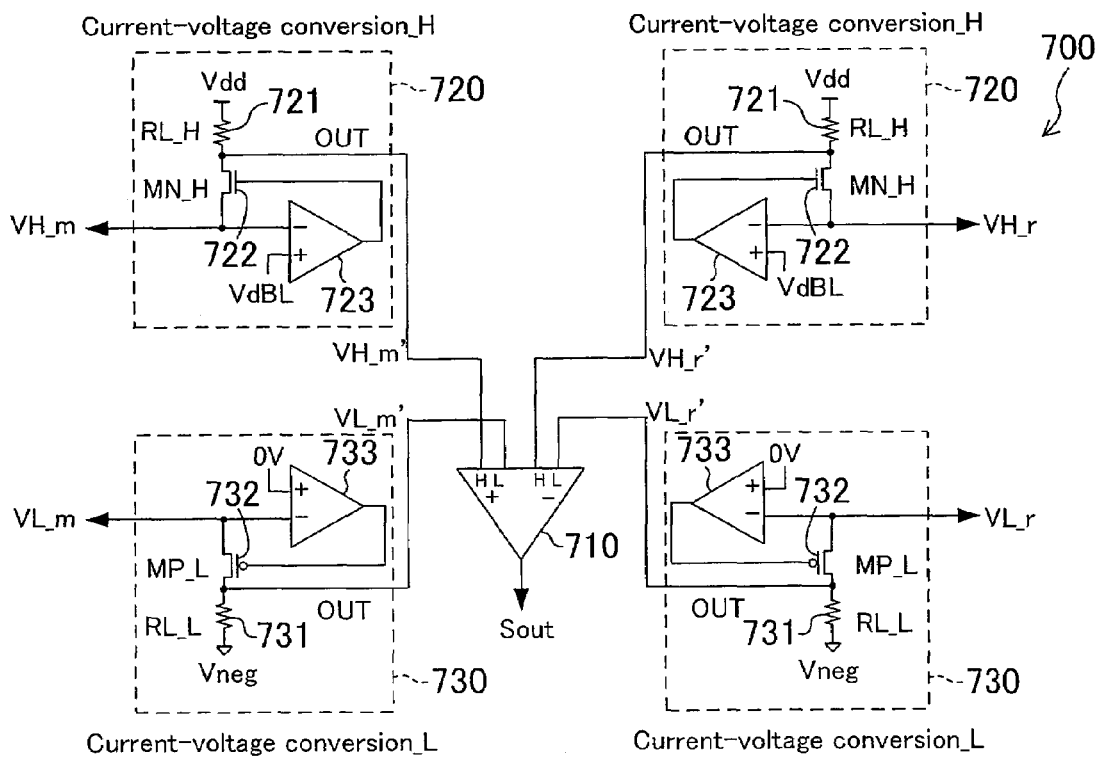
FIG. 12 is a block diagram showing a configuration of an amplifier section in a sense circuit according to Embodiment 7 of the present invention.

An amplifier section as shown in FIG. 12 may be used in place of the amplifier section of Embodiments 5 and 6. The present amplifier section is an example of a current-driven type amplifier capable of replacing the amplifier section (voltage-type dual differential amplifier) of Embodiments 5 and 6.

FIG. 12 is a block diagram showing a configuration of an amplifier section 700 of Embodiment 7. As shown in FIG. 12, the amplifier section 700 includes a voltage-type dual differential amplifier 710, current-voltage conversion circuits 720 (current-voltage conversion_H), and current-voltage conversion circuits 730 (current-voltage conversion_L). As shown in the figure, the amplifier section 700 includes the current-voltage conversion circuits 720 for the high-side nodes and the current-voltage conversion circuits 730 for the low-side nodes inserted before the four input terminals of the voltage-type dual differential amplifier 710.

The voltage-type dual differential amplifier 710 is the amplifier section (voltage-type dual differential amplifier) of Embodiments 5 and 6.

The current-voltage conversion circuit 720 includes a resistor 721, a control Nch transistor 722 and a differential amplifier 723 as shown in FIG. 12. The current-voltage conversion circuit 720 is such that the control Nch transistor 722 is controlled by the differential amplification output of the differential amplifier 723, which receives a predetermined voltage VdBL at one node thereof, and a voltage obtained by stepping down the power supply voltage Vdd according to the current flow is output from the output terminal OUT, so that a current is output at a constant voltage from the power supply Vdd via the resistor 721 and the control Nch transistor 722. Specifically, the output VH_m' is output to the terminal VH_m, and the output VH_r' is output to the terminal VH_r.

The current-voltage conversion circuit 730 includes a resistor 731, a control Pch transistor 732 and a differential amplifier 733. The current-voltage conversion circuit 730 is such that the control Pch transistor 732 is controlled by the differential amplification output of the differential amplifier 733, which receives a predetermined voltage 0 V at one node thereof, and a voltage obtained by stepping up the negative power supply Vneg is output from the output terminal OUT, so that a current is output at a constant voltage from the negative power supply Vneg via the resistor 731 and the control Pch transistor 732. Specifically, the output VL_m' is output to the terminal VL_m, and the output VL_r' is output to the terminal VL_r.

In the amplifier section 700 having such a configuration, both on the memory cell 2000 side and on the reference cell 3000 side, a current value as the sum of the high-side current value and the low-side current value is evaluated (in practice, the difference between the high-side current value and the low-side current value is evaluated since the vector direction is reversed).

Figure 13:
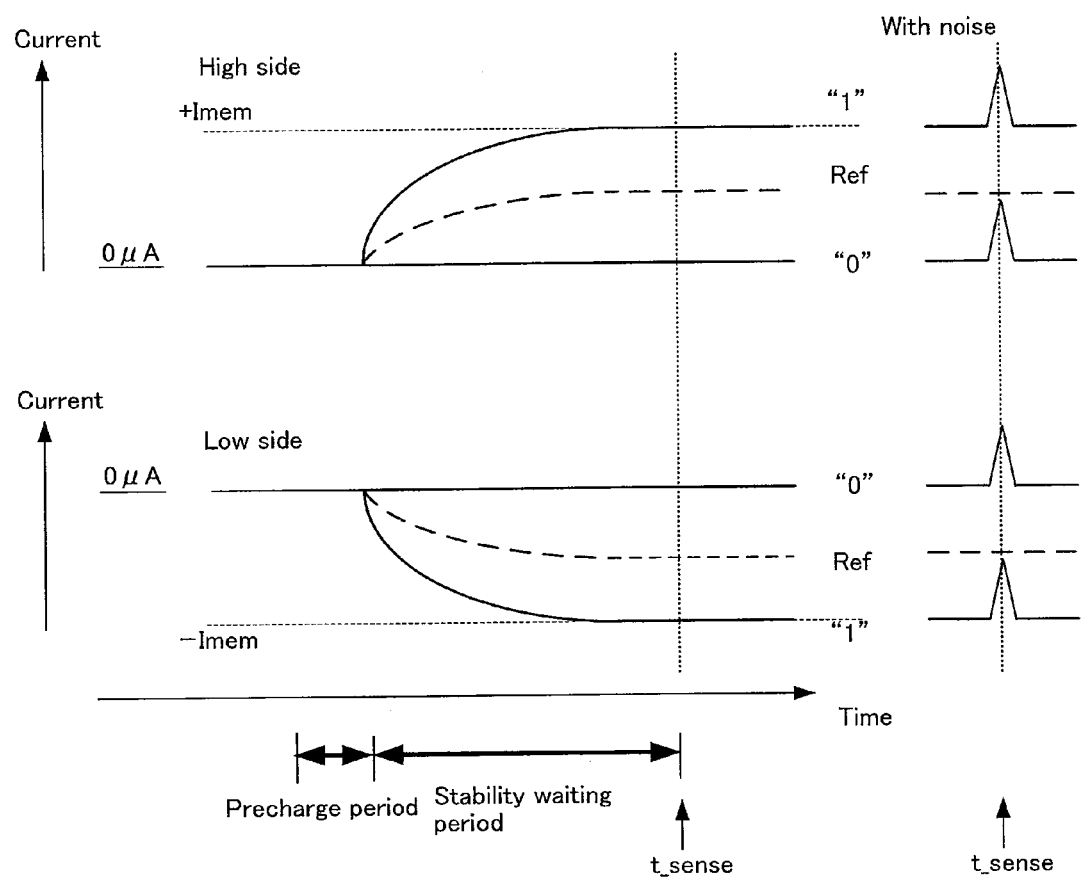
FIG. 13 is a diagram showing, for each of the high side and the low side, a current flowing in an amplifier section of a sense circuit according to Embodiment 7 of the present invention.

Therefore, for example, if some noise is introduced to the wire pair 220 in a circuit obtained by employing the amplifier section 700 in place of the amplifier section of Embodiment 5, substantially the same noise will appear on the bit line 220a and on the bit line 220b. The noise is canceled as in Embodiment 5 through the voltage-type dual differential amplifier 710 after the current-voltage conversion. FIG. 13 shows, for the high side and for the low side, a current flowing through the amplifier section 700 when the amplifier section 700 is employed in place of the amplifier section of Embodiment 5.

As described above, it is possible to realize a sensing operation with desirable noise resistance also when a current-driven type amplifier is used.

EMBODIMENT 8 OF PRESENT INVENTION

An example where the sense circuit described above is applied to a semiconductor non-volatile memory employing a virtual ground array architecture (Virtual Ground Array Architecture; hereinafter abbreviated to "VGA") for the memory array will be described.

Figure 14:
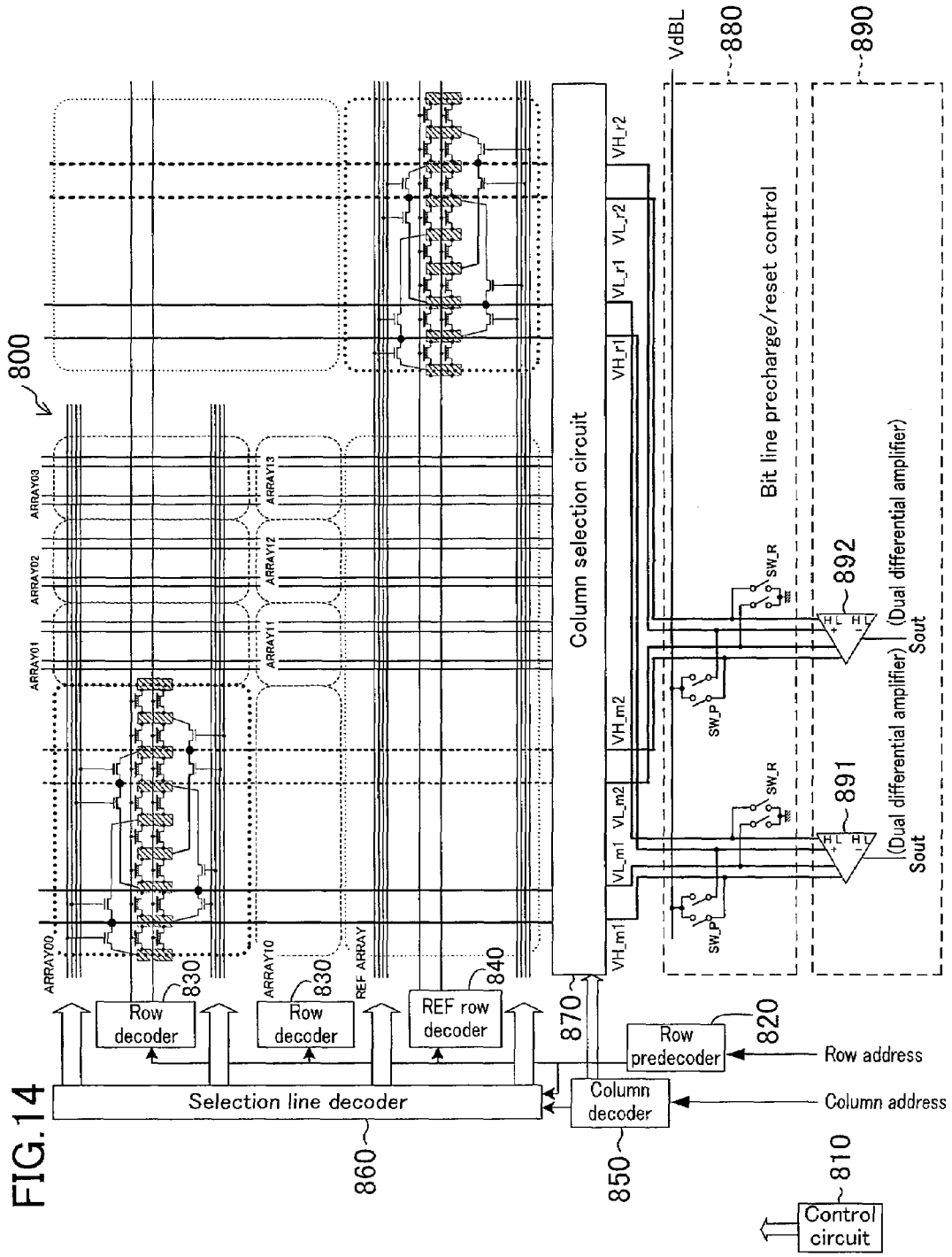
FIG. 14 is a block diagram showing a configuration of a semiconductor non-volatile memory according to Embodiment 8 of the present invention.

FIG. 14 is a block diagram showing a configuration of a semiconductor non-volatile memory 800 according to Embodiment 8 of the present invention, and shows what is needed for describing the configuration with respect only to the read operation.

(General Configuration)

The semiconductor non-volatile memory 800 is a memory of a virtual ground array architecture (hereinafter referred to as the "VGA structure"), including a plurality of array units (ARRAY00-13), a reference cell array (REF ARRAY), a control circuit 810, a row predecoder 820, a row decoder 830, a REF row decoder 840, a column decoder 850, a selection line decoder 860, a column selection circuit 870, a precharge/reset control circuit 880, and a sense circuit block 890, as shown in FIG. 14, and is configured as a MONOS type non-volatile memory.

(Configuration of Memory Array Section)

The present embodiment will be described with respect to an example where two word lines are provided for one sector, for the sake of simplicity.

In the semiconductor non-volatile memory 800, ARRAY00-03 employing the VGA structure are arranged on the sub-bit lines successively in the word line direction, as shown in FIG. 14, and the reference bit line unit is further provided.

At the stage below ARRAY00-03, ARRAY10-13 are arranged as a separate sector, and a block of reference bit lines is similarly provided.

At the stage further below, a reference cell array including 2 rows by 8 columns of cells is provided. Also to the reference cell array, reference word lines RWL[10]-[11] similar to the word lines WL[00]-[01] of the memory cell array, reference selection lines RSL[00]-[07] similar to the selection line signals SL[00]-[07], reference main bit lines RMBL[0]-[3] similar to the main bit lines MBL[0]-[3] are connected.

(Configuration of Array Units Array00-13)

Since the array units ARRAY00-13 all have similar configurations, only ARRAY00 will be described below.

Figure 15:
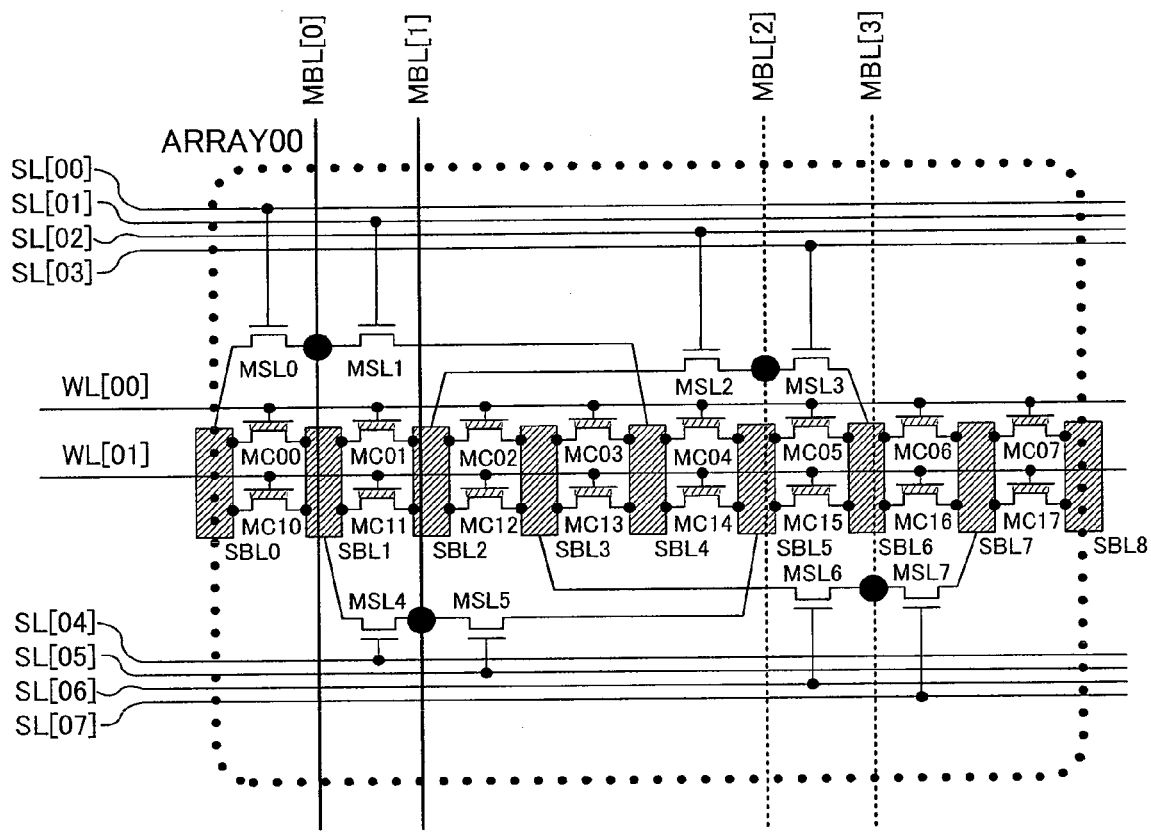
FIG. 15 is a block diagram showing a configuration of an array unit of a semiconductor non-volatile memory according to Embodiment 8 of the present invention.

FIG. 15 is a block diagram showing a configuration of ARRAY00. ARRAY00 includes a total of 16 memory cells (2 rows by 8 columns) arranged in a VGA structure, and the word lines WL[00] and WL[01] for selecting memory cells are connected to the memory cells associated therewith. Sub-bit lines SBL0-7 are connected to the main bit lines MBL[0]-[3] as controlled by the selection line signals SL[00]-[07]. ARRAY01-03 in the word line direction have similar structures, wherein sub-bit lines are selectively connected to main bit lines.

ARRAY00 of the present embodiment is configured so that two read operations can be performed simultaneously. For example, in ARRAY00, a memory cell MC04 and a memory cell MC02 are read out simultaneously.

In ARRAY00, the memory cells MC02 and MC04 are connected to the same word line WL[00] as shown in FIG. 15.

The source and the drain of the memory cell MC02 are connected to the sub-bit lines SBL2 and SBL3, respectively. The drain of the memory cell MC04 is connected to the sub-bit line SBL4, and the source of the memory cell MC04 is connected to the sub-bit line SBL5. Thus, drains of the two memory cells being read out simultaneously are arranged continuously with a memory cell being interposed therebetween.

The source and the drain of the memory cell MC02 are connected to the main bit lines MBL[1]-[0] via selection gate transistors MSL5 and MSL1 of the sub-bit lines SBL2 and SBL3, respectively. The main bit lines MBL[1]-[0] are connected to the nodes VL_m1 and VH_m1, respectively, of a sense circuit 891 via the column selection circuit 870.

The source and the drain of the memory cell MC04 are similarly configured and are connected to the nodes VL_m2 and VH_m, respectively, of a sense circuit 892.

The other memory cells (MC00, MC01, etc.) are also connected to sub-bit lines, as shown in FIG. 15, and are further connected to main bit lines via selection gate transistors.

(Configuration of Reference Cell Array)

Figure 16:
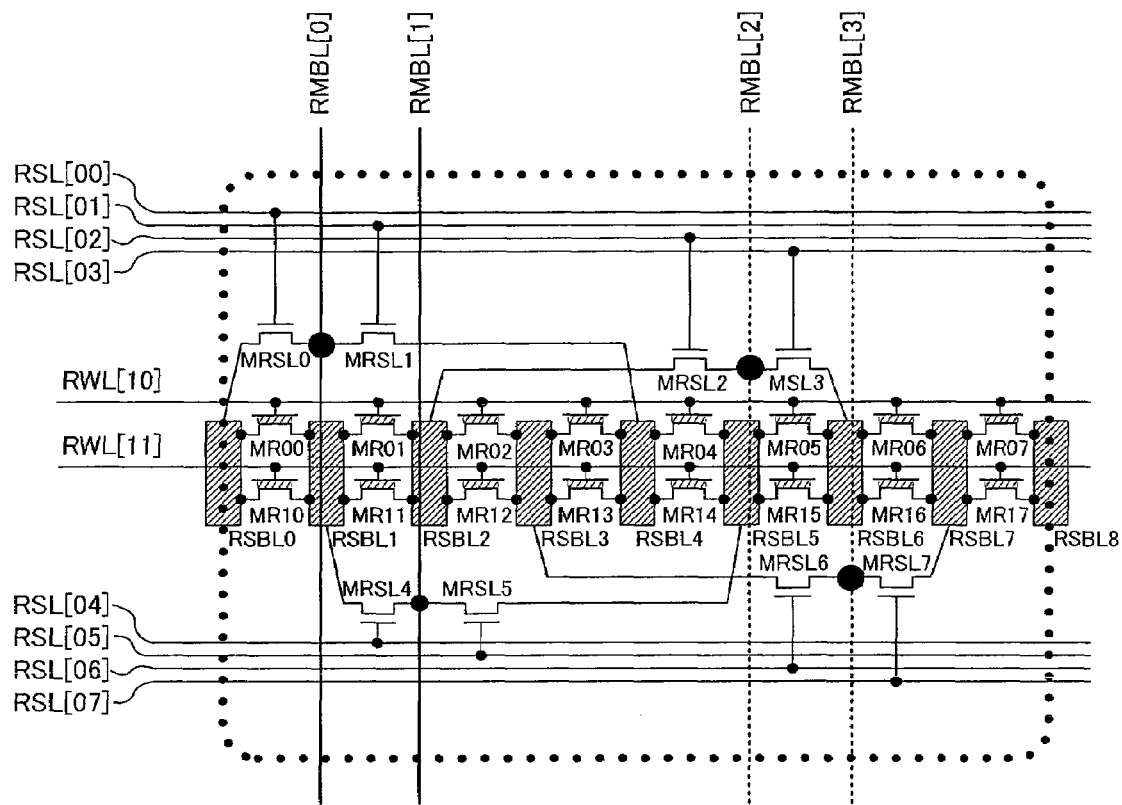
FIG. 16 is a block diagram showing a configuration of a reference cell array of a semiconductor non-volatile memory according to Embodiment 8 of the present invention.

In the reference cell array, as shown in FIG. 16, the reference cells MR02 and MR04 are arranged, as are the memory cells, in the order of the source the reference cell MR02, the drain of the reference cell MR02, the drain of the reference cell MR04 and the source of the reference cell MR04, which are connected to reference sub-bit lines RSBL2, RSBL3, RSBL4 and RSBL5, respectively. Then, they are connected to the reference main bit lines RMBL[1]-[3] via reference selection gate transistors MRSL6, MRSL2, MRSL5 and MRSL1.

The reference main bit lines RMBL[1]-[3] are connected to the nodes VL_r1, VH_r1, VL_r2 and VH_r2, respectively, via the column selection circuit 870.

The other reference memory cell (MR00, MR01, etc.) are also connected to reference sub-bit lines, as shown in FIG. 16, and are further connected to reference main bit lines via reference selection gate transistors.

Also in the present embodiment, bit lines connecting the cells with the sense circuits (the sense circuit 891, the sense circuit 892) are laid out so that a high-side line and a low-side line are paired as a wire pair so that the stray capacitances will be in symmetry as in the preceding embodiments.

(Configuration of Control Section and Data Router System Controlling Memory Array Section)

The control circuit 810 controls the information read operation from ARRAY00-13 according to a control signal received from outside.

The row predecoder 820 predecodes the received row address.

The control circuit 810 decodes the predecoded row address to activate the word line.

The REF row decoder 840 decodes the predecoded row address to activate the reference word line.

The column decoder 850 decodes the received column address.

According to the column address decoded by the column decoder 850, the selection line decoder 860 outputs selection signals SL[00]-[07], which determine the connections between main bit lines and sub-bit lines on the memory cell side, and selection signals RSL[00]-[07], which determine the connections between main bit lines and sub-bit lines on the reference cell side.

The column selection circuit 870 connects a main bit line and a reference main bit line to the precharge/reset control circuit 880 according to the column address decoded by the column decoder 850.

The precharge/reset control circuit 880 precharges and resets the bit line of the selected memory cell and the bit line of the reference cell. Specifically, a bit line read-out voltage VdBL is applied via the switch SW_P to the nodes VH_m1 and VH_m2 being the high-side nodes of the sense circuit 891 and the sense circuit 892 to precharge the nodes, and a bit line voltage of 0 V is applied via the switch SW_R to the nodes VL_m1 and VL_m2 being the low-side nodes of the sense circuit 891 and the sense circuit 892 to reset the bit line voltage. Similarly, the bit line read-out voltage VdBL is applied via the switch SW_P to VH_r1 and VH_r2 to precharge the nodes, and a bit line voltage of 0 V is applied via the switch SW_R to VL_r2 and VL_r1 to reset the bit line voltage.

The sense circuit block 890 includes the sense circuit 891 and the sense circuit 892. The sense circuit 891 and the sense circuit 892 read out signals from selected bit lines. Specifically, the sense circuit 891 is a sense circuit as described above in Embodiment 5, for example, and outputs a signal of a voltage according to the voltages (or currents) input to the high-side node (the nodes VH_m1 and VH_r1) and the low-side node (the nodes VL_m1 and VL_r1). Similarly, the sense circuit 892 outputs a signal of a voltage according to the voltages (or currents) input to the high-side nodes (the nodes VH_m2 and VH_r2) and the low-side nodes (VL_m2 and VL_r2). For example, the voltage output from the sense circuit 891 is (VH_m1-VH_r1)-(VL_m1-VL_r1) when the voltages at these nodes are VH_m1, VH_r1, VL_m1 and VL_r1.

The differences between the present embodiment and Embodiment 5 can be summarized in the following three points: the memory array employed is of a VGA structure; two lines of read operation are included; and a hierarchical bit line configuration is employed. With respect to the hierarchical bit line configuration, it only means the addition of the transfer gates (the selection gate transistor and the reference selection gate transistor) in the wire pair connecting the memory cell with the sense amplifier, and raises no need to alter the discussion heretofore.

The VGA structure described above differs from the array configuration illustrated in Embodiment 5 in the arrangement of memory cells and reference cells. Typically, in a VGA structure, a drain and a source of a memory cell are connected successively.

In the semiconductor non-volatile memory 800 having such a configuration, when the memory cells MC02 and MC04 are read out simultaneously, for example, the word line WL[00] is first activated for a read operation to transition to the high level.

Thus, all the memory cells (MC00-MC07) connected to the word line WL[00] are activated, thereby bringing forth the potential of each of these cells for producing a read-out current between the drain and the source thereof according to the information ("0" or "1") stored therein. Specifically, when information is read out from the memory cells MC02 and MC04, neighboring memory cells (bits) connected to the drains and the sources thereof, i.e., memory cells MCO1, MC03 and MC05, have the potential of producing a current. For example, if these memory cells are not connected, a current will not flow out of (or flow into) neighboring bit lines, thus resulting in the same situation as that with the circuit of Embodiment 5 described above.

Then, a pair of main bit lines MBL[0] and MBL[1] are connected to the node VH_ml and the node VL_ml, respectively, by the column selection circuit 870, and a pair of main bit lines MBL[2] and MBL[3] are connected to the node VL_m2 and the node VH_m2.

The selection lines SL[01], SL[02], SL[05] and SL[06] are activated so as to select MSL01, MSL02, MSL05 and MSL06. A pair of main bit lines MBL[0] and MBL[1] are connected to the sub-bit lines SBL4 and SBL5, respectively, and a pair of main bit lines MBL[2] and MBL[3] are connected to the sub-bit lines SBL2 and SBL3, respectively.

Then, the precharge switch SW_P is turned ON and the reset switch SW_R is turned ON by the control circuit 810, and the selected word line WL[00] is activated.

Even if the word line is activated, the value of the memory cell current is very small, and the voltage decrease or increase of the bit line due to the current is negligible, whereby the sub-bit lines SBL2, SBL3, SBL4 and SBL5 are precharged/reset to 0 V, VdBL, VdBL and 0 V, respectively.

At this time, a similar operation is performed also on the reference side (reference cell array). It is assumed herein that all the other bit lines are discharged to 0 V. The bit line precharge level VdBL is typically about 1 V in the case of a non-volatile memory such as an FG type memory, in view of problems such as the disturbance.

Then, the precharge switch SW_P and the reset switch are turned OFF. Thus, the potentials of the sub-bit lines SBL2, SBL3, SBL4 and SBL5 start to change.

Among a series of memory cells MC01-MC05 for which the word line is activated, the memory cells MC02 and MC04 are the only memory cells having the source-drain voltage applied thereacross, and the voltage across the other memory cells is 0 V. Therefore, according to the information stored in the memory cells MC02 and MC04, a read-out current starts to flow from the sub-bit line SBL3 to SBL2 and from the sub-bit line SBL4 to SBL5.

For example, assuming that the memory cell MC02 stores "1" as the information and the memory cell MC04 stores "0" as the information, the voltage of the sub-bit line SBL2 increases while the voltage of the sub-bit line SBL3 decreases, and the voltages of the sub-bit lines SBL4 and SBL5 do not decrease or increase. However, the source-drain voltage difference gradually grows in the memory cells MC01 and MC03. If the information stored in the memory cell MC01 or MC03 is "1", which means a current flow, the growing voltage difference will become influential on the voltage transitions of the sub-bit lines SBL2 and SBL3. (Such an effect of a leak current to neighboring memory cells, which is unique to the VGA structure, is commonly referred to as the "neighboring effect".)

In practice, it is possible to design a circuit so that a sensing operation is performed with the source-drain voltage of a memory cell adjacent to the bit being read out being about 100 mV or less. Since the source-drain voltage difference of the memory cell being read out is about 1 V or more while the source-drain voltage difference of a neighboring memory cell possibly influencing the voltage transition is about 100 mV or less, there is a difference in current by a factor of 10 or so, whereby the degree of influence is sufficiently small.

Therefore, even though other active memory cells are connected adjacent to the memory cell being read out, the influence of such memory cells is negligible, thereby enabling a read operation.

While the present embodiment has been described above with respect to a configuration where two bits, i.e., the memory cells MC02 and MC04, are read out simultaneously, the following problem occurs if only one bit is read out.

For example, assume a case where only the memory cell MC04 is read out. In such a case, selection lines related to the sub-bit lines SBL2 and SBL3, which are related to the memory cell MC02 side, are not precharged or reset.

If the sub-bit line SBL4 is precharged and then the precharge is released, the information stored in the memory cell MC03 influences the voltage transition of the sub-bit line SBL4 after the precharge is released. This is because since the sub-bit line SBL3, which is the source of the neighboring memory cell MC03, is no longer precharged, the potential thereof stays at a low voltage (stays at 0 V in some cases), whereby the charge of the precharged sub-bit line SBL4 is in some cases partially extracted by the sub-bit line SBL3 via the memory cell MC03.

A countermeasure to this is as follows. Where information being "0" is read out from the memory cell MC04, for example, if the information of the memory cell MC03 is "1", the neighboring sub-bit line (SBL3) needs to be controlled to be precharged at the precharge potential VdBL or kept at the precharge potential throughout the read period, even when reading out only the memory cell MC04.

Also when a current-driven type amplifier as shown in FIG. 12 is used as the sense circuit in place of the voltage-type dual differential amplifier with the same circuit configuration otherwise, it is possible to realize a information-reading system that is resistant to noise, as in a case where a current-driven type amplifier is applied to an ordinary array configuration (Embodiment 4). Specifically, with a current-driven type amplifier, the drain-source voltage of a read-out memory cell is kept at the precharge level (VdBL) and the reset voltage (0 V) is maintained during a read period, whereby the neighboring memory cell has no source-drain voltage. Therefore, the neighbor effect as described above is eliminated, thus realizing a sensing operation with an even higher sensitivity.

As described above, also in the present embodiment, the sensed data will not be determined erroneously, thereby realizing a read operation that is resistant to noise.

While the present embodiment has been directed to an example where there are two outputs, more array units may be arranged in the word line direction to realize a configuration capable of producing multi-bit outputs.

While the description above has been directed to an example where the reference cell-side circuit is made of exactly the same elements as is the memory cell-side circuit, a minimum array scale made in view of the symmetry with the memory cell side is sufficient, and the number of reference word lines, reference main bit lines and reference sub-bit lines on the reference side, etc., may be determined in view of the symmetry with the memory side.

EMBODIMENT 9 OF PRESENT INVENTION

Figure 17:
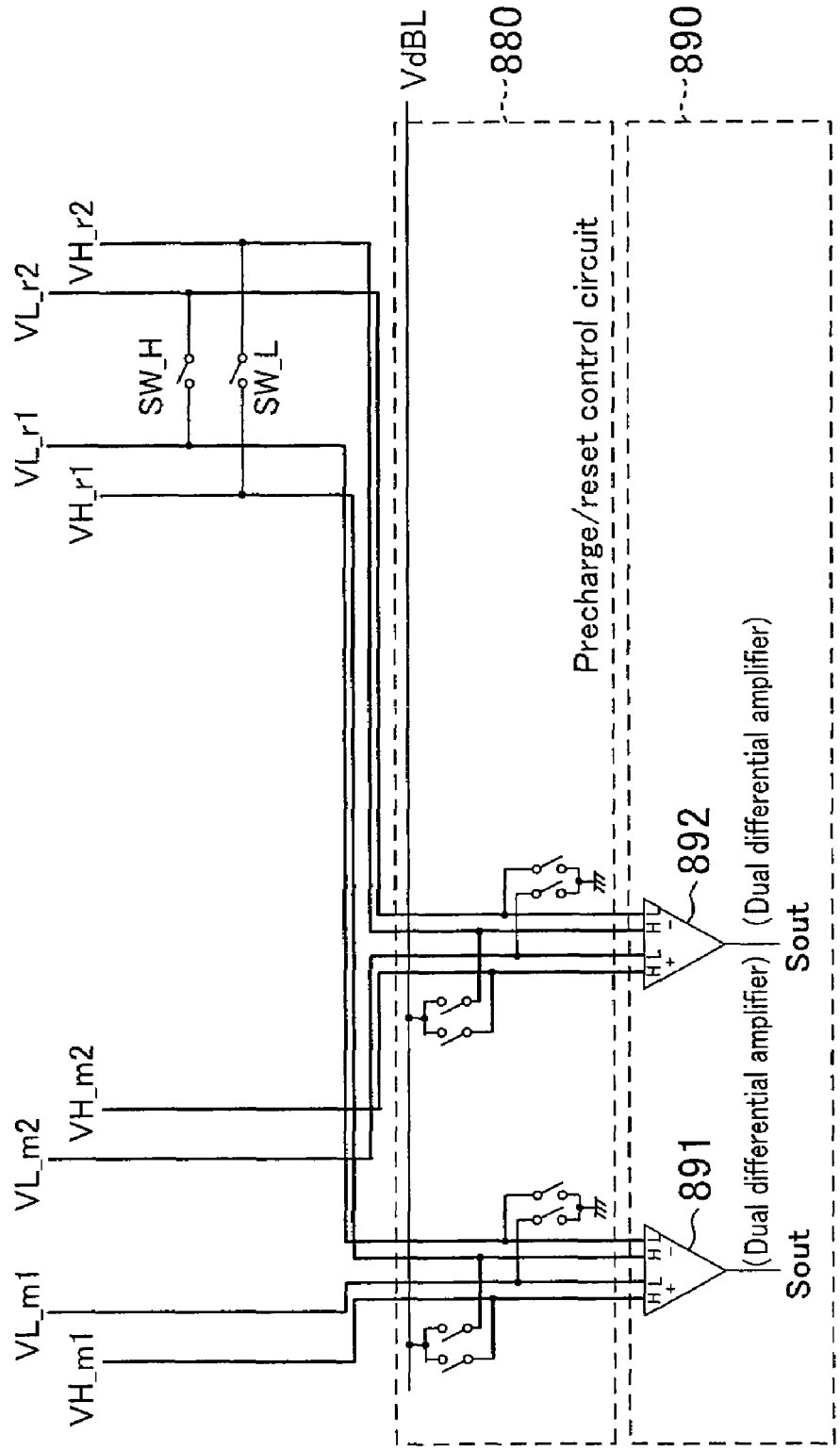
FIG. 17 is a block diagram showing a part of a configuration of a semiconductor non-volatile memory according to Embodiment 9 of the present invention.
Figure 18:
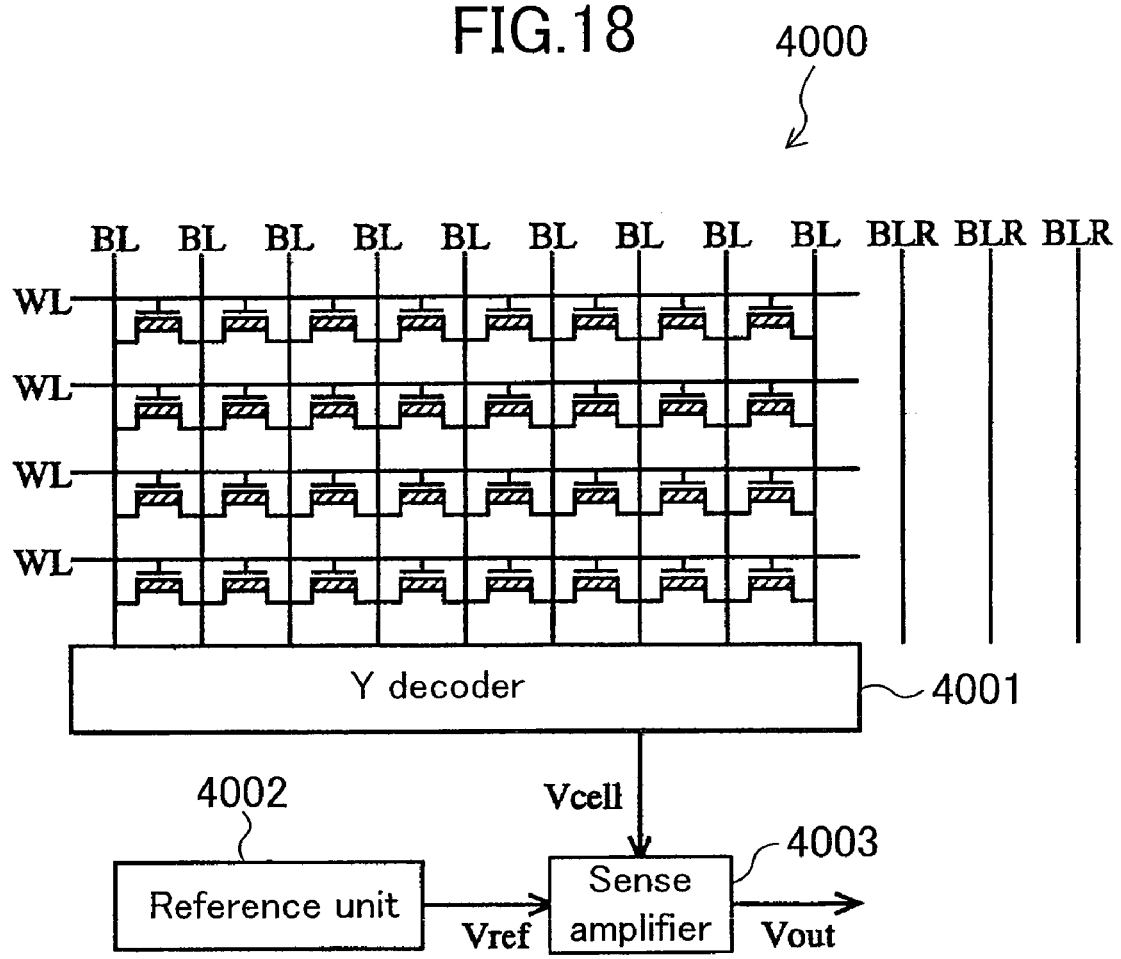
FIG. 18 is a block diagram showing a configuration of a conventional semiconductor non-volatile memory.

An example of a semiconductor non-volatile memory where the amount of current of the reference cell itself does not need to be adjusted to an intermediate level will be described. Specifically, as compared with the circuit of Embodiment 8, switches SW_H and SW_L are added between the bit line-side nodes VH_r1 and VH_r2 of the reference cell and between VL_r1 and VL_r2, respectively, as shown in FIG. 17, wherein the high-side nodes are shorted together and the low-side nodes are shorted together in a read operation.

Embodiments 1-8 above have been directed to an example where information being "0" represents no current flow, information being "1" represents a current flow, and the read-out current of the reference cell 3000 is adjusted to one half of that of the memory cell 2000. However, a sense amplifier in practice may be configured to sense a large current flow as being "1" and a small current flow as being "0", and a reference cell may be employed whose read-out current is adjusted to a current value that is about the intermediate value between the two.

In the present embodiment, memory cells which turn into a state where a large current flows when stored "1" is read out and into another state where only a small current flows when "0" is read out are used in the reference cell array, wherein reference cells storing "1" therein are used as reference cells connected to VH_r1 and VL_r1, and reference cells storing "0" therein are used as reference cells connected to VH_r2 and VL_r2.

With a semiconductor non-volatile memory having such a configuration, when the high-side nodes are shorted together and the low-side nodes are shorted together in a read operation, the current flowing through two nodes on the high side and two nodes on the low side is equal to the sum of the current which flows when "0" is read out and the current which flows when "1" is read out, in a case where a current-driven type amplifier is used as the sense circuit 891, and the like, for example. Therefore, the effective current flowing through one node of the sense amplifier becomes equal to the average between the current which flows when "0" is read out and the current which flows when "1" is read out, thereby resulting in an operation equivalent to that of a reference whose current value is adjusted to a current value that is about the intermediate value between the two.

In a case where a voltage-type dual differential amplifier is used, the current flowing through each of the two nodes on the high side and the two nodes on the low side of the reference cell is the sum of the current which flows when "0" is read out and the current which flows when "1" is read out. On the other hand, the capacitance of the reference main bit line is doubled, whereby the effective reference current flowing in a sensing operation becomes equal to the average between the current which flows when "0" is read out and the current which flows when "1" is read out, thereby resulting in an operation equivalent to that of a reference whose current value is adjusted to a current value that is about the intermediate value between the two.

According to the present embodiment, the amount of current flowing into the sense amplifier can be adjusted by using reference cells storing information being "0" and reference cells storing information being "11", whereby the amount of current of the reference cell itself does not need to be adjusted to the intermediate level. Therefore, it is possible to eliminate the circuit for adjusting the read-out current of the reference cell to the intermediate level.

The number of bits stored in memory cells described in various embodiments above is not limited to any particular number. For example, effects of the embodiments above can be realized also when applying the present invention to the level-based multi-value system (in which the stored value is weighted not based on the presence/absence of the current flow through the memory cell, but based on the amount of current flowing therethrough to thereby store four values, or two bits, e.g., "00", "01", "10" and "11"), which is common as multi-value memory. The present invention can also be applied to a MONOS type non-volatile memory of what is called a "physical multi-value system". This is a memory storing information based on whether a local charge is accumulated at each of the drain terminal and the source terminal. On the drain-terminal side, the drain terminal is depleted by an applied voltage, and therefore the cell current is not modulated by the accumulation of a charge at the drain terminal, but the cell current is modulated by the presence/absence of a charge accumulated at the source terminal. Thus, it is possible to store information independently at the drain and at the source of a single memory cell. The drain side and the source side can be read out by shifting the point of read operation from one to another.

For example, in FIG. 14, information at the left-side node terminal (source) is read out in the memory cell MC02 on the left side, whereas information at the right-side node terminal (source) is read out in the memory cell MC04 on the right side. As the memory cell read out is shifted from one to another, the positional relationship between the drain and the source, one on the left and the other on the right, is reversed. Therefore, it is possible to read out information from both sides, whereby effects of the embodiments above can be realized also in a MONOS type 2-bit cell.

While Embodiment 8 has been directed to an example of a MONOS type non-volatile memory, the device type, etc., are not limited in the present invention as long as the memory is one that is implemented by an element whose current varies depending on the memory state thereof, and the present invention can be applied to non-volatile memories such as NAND type memories and floating gate type memories, for example.

INDUSTRIAL APPLICABILITY

The current or voltage measurement circuit of the present invention has an effect of enabling a measurement of a voltage difference or a current difference that is resistant to noise and has a high precision, and the present invention is useful as a voltage measurement circuit for measuring a voltage between two terminals of a measured object, a current measurement circuit for measuring a current flowing into one of two terminals of a measured object and a current flowing out of the other terminal, a sense circuit for reading out information stored in a memory cell, a semiconductor non-volatile memory, etc.

The invention claimed is:

1. A sense circuit, comprising:
   a wire pair including a source line being a bit line that is connected to a source diffusion region of a memory cell and a drain line being a bit line that is connected to a drain diffusion region of the memory cell, wherein the source line and the drain line are configured so that a stray capacitance of the source line and a stray capacitance of the drain line are substantially equal to each other;
   a differential amplifier for differentially amplifying a voltage on the source line and a voltage on the drain line;
   a first precharge circuit for precharging the source line to a first voltage potential; and
   a second precharge circuit for precharging the drain line to a second voltage potential, wherein:
       the differential amplifier is configured so as to perform a differential amplification operation after the precharge of the source line and that of the drain line are released;
   two each of the wire pairs, the differential amplifiers, the first precharge circuits and the second precharge circuits are provided, one for reference memory cells and another for read-out memory cells from which data is read out;
   a voltage of an output of the differential amplifier for read-out memory cells and a voltage of an output of the differential amplifier for reference memory cells are differentially amplified.

2. A semiconductor non-volatile memory of a virtual ground array architecture, comprising the sense circuit of claim 1, wherein:
   the second precharge circuit for read-out memory cells is configured so that when a read-out memory cell is to be read out, the second precharge circuit for read-out memory cells precharges a drain line of another read-out memory cell that is adjacent to the read-out memory cell being read out; and
   the second precharge circuit for reference cells is configured so as to precharge a drain line of a reference memory cell that is adjacent to a reference memory cell being read out.

3. The semiconductor non-volatile memory of claim 2, wherein a precharge voltage by the first precharge circuit for read-out memory cells and a precharge voltage by the first precharge circuit for reference cells are at an equal potential.

4. The semiconductor non-volatile memory of claim 2, wherein a precharge voltage by a second precharge circuit for read-out memory cells and a precharge voltage by a second precharge circuit for reference cells are at an equal potential.

5. The semiconductor non-volatile memory of claim 2, wherein the memory cell is a floating gate type memory cell or a MONOS (Metal Oxide Nitride Oxide Semiconductor) type memory cell.

6. A sense circuit, comprising:
   a wire pair including a source line being a bit line that is connected to a source diffusion region of a memory cell and a drain line being a bit line that is connected to a drain diffusion region of the memory cell, wherein the source line and the drain line are configured so that a stray capacitance of the source line and a stray capacitance of the drain line are substantially equal to each other;
   a differential amplifier for differentially amplifying a voltage on the source line and a voltage on the drain line; and
   a current monitor for outputting a voltage signal according to an amount of current flowing through the source line and a voltage signal according to an amount of current flowing through the drain line,
   wherein the differential amplifier is configured so as to differentially amplify a signal output from the current monitor.

7. The sense circuit of claim 6, further comprising two current monitors for outputting a voltage signal according to an amount of current flowing through the source line and a voltage signal according to an amount of current flowing through the drain line, one for reference memory cells and another for read-out memory cells, wherein:
   the differential amplifier for read-out memory cells is configured so as to differentially amplify a signal output from the current monitor for read-out memory cells;
   the differential amplifier for reference memory cells is configured so as to differentially amplify a signal output from the current monitor for reference memory cells.

8. A semiconductor non-volatile memory of a virtual ground array architecture, comprising:
   the sense circuit of claim 7;
   a first precharge circuit for precharging the source line to a first voltage potential; and
   a second precharge circuit for precharging the drain line to a second voltage potential, wherein:
   two each of the wire pairs, the differential amplifiers, the first precharge circuits and the second precharge circuits are provided, one for reference memory cells and another for read-out memory cells from which data is read out; and
   the second precharge circuit for reference cells is configured so as to precharge a drain line of a reference memory cell that is adjacent to a reference memory cell being read out.

9. The semiconductor non-volatile memory of claim 8, wherein a precharge voltage by the first precharge circuit for read-out memory cells and a precharge voltage by the first precharge circuit for reference cells are at an equal potential.

10. The semiconductor non-volatile memory of claim 8, wherein a precharge voltage by a second precharge circuit for read-out memory cells and a precharge voltage by a second precharge circuit for reference cells are at an equal potential.

11. The semiconductor non-volatile memory of claim 8, wherein the memory cell is a floating gate type memory cell or a MONOS (Metal Oxide Nitride Oxide Semiconductor) type memory cell.

12. A semiconductor non-volatile memory of a virtual ground array architecture, comprising:
the sense circuit of claim 6;
a first precharge circuit for precharging the source line to a first voltage potential;
a second precharge circuit for precharging the drain line to a second voltage potential; and
the second precharge circuit is configured so that when a memory cell is to be read out, the second precharge circuit precharges a drain line of another memory cell that is adjacent to the memory cell being read out.

13. The semiconductor non-volatile memory of claim 12, wherein the memory cell is a floating gate type memory cell or a MONOS (Metal Oxide Nitride Oxide Semiconductor) type memory cell.

14. A semiconductor non-volatile memory of a virtual ground array architecture, comprising:
the sense circuit of claim 6;
a first memory cell and a second memory cell configured so as to be read out simultaneously; and
a third memory cell provided between the first memory cell and the second memory cell,
wherein the third memory cell is configured so that when the first memory cell and the second memory cell are to be read out simultaneously, a source line and a drain line connected to the third memory cell are precharged to the same potential.

15. The semiconductor non-volatile memory of claim 14, wherein the memory cell is a floating gate type memory cell or a MONOS (Metal Oxide Nitride Oxide Semiconductor) type memory cell.

16. The semiconductor non-volatile memory of claim 14, wherein for each of the first memory cell, the second memory cell and the third memory cell, there are those for reference memory cells and those for read-out memory cells.

17. The semiconductor non-volatile memory of claim 16, further comprising a switch for, when the reference cell is to be read out, electrically connecting a source line of the reference cell being read out with a source line of another reference memory cell and electrically connecting a drain line of the reference cell being read out with a drain line of the other reference cell, wherein:
the reference memory cell being read out is configured so that when the reference memory cell is read out, the reference memory cell is read out simultaneously with another reference cell; and
predetermined information are stored in the two reference memory cells to be read out simultaneously so that different currents flow when reading out the two reference memory cells.

18. The semiconductor non-volatile memory of claim 16, wherein a precharge voltage by the first precharge circuit for read-out memory cells and a precharge voltage by the first precharge circuit for reference cells are at an equal potential.

19. The semiconductor non-volatile memory of claim 16, wherein a precharge voltage by a second precharge circuit for read-out memory cells and a precharge voltage by a second precharge circuit for reference cells are at an equal potential.

20. A semiconductor non-volatile memory of a virtual ground array architecture, comprising:
a sense circuit;
a first memory cell and a second memory cell configured so as to be read out simultaneously; and
a third memory cell provided between the first memory cell and the second memory cell, wherein:
the third memory cell is configured so that when the first memory cell and the second memory cell are to be read out simultaneously, a source line and a drain line connected to the third memory cell are precharged to the same potential;
for each of the first memory cell, the second memory cell and the third memory cell, there are those for reference memory cells and those for read-out memory cells;
the sense circuit, comprising:
a wire pair including a source line being a bit line that is connected to a source diffusion region of a memory cell and a drain line being a bit line that is connected to a drain diffusion region of the memory cell, wherein the source line and the drain line are configured so that a stray capacitance of the source line and a stray capacitance of the drain line are substantially equal to each other;
a differential amplifier for differentially amplifying a voltage on the source line and a voltage on the drain line;
a first precharge circuit for precharging the source line to a first voltage potential; and
a second precharge circuit for precharging the drain line to a second voltage potential, wherein:
the differential amplifier is configured so as to perform a differential amplification operation after the precharge of the source line and that of the drain line are released.

21. The semiconductor non-volatile memory of claim 20, further comprising a switch for, when the reference cell is to be read out, electrically connecting a source line of the reference cell being read out with a source line of another reference memory cell and electrically connecting a drain line of the reference cell being read out with a drain line of the other reference cell, wherein:
the reference memory cell being read out is configured so that when the reference memory cell is read out, the reference memory cell is read out simultaneously with another reference cell; and
predetermined information are stored in the two reference memory cells to be read out simultaneously so that different currents flow when reading out the two reference memory cells.

22. The semiconductor non-volatile memory of claim 20, wherein a precharge voltage by the first precharge circuit for read-out memory cells and a precharge voltage by the first precharge circuit for reference cells are at an equal potential.

23. The semiconductor non-volatile memory of claim 20, wherein a precharge voltage by a second precharge circuit for read-out memory cells and a precharge voltage by a second precharge circuit for reference cells are at an equal potential.

* * * * *